(12) United States Patent
Hopkins et al.

(10) Patent No.: US 9,230,986 B2
(45) Date of Patent: Jan. 5, 2016

(54) 3D MEMORY

(71) Applicant: Micron Technology, Inc., Boise, ID (US)

(72) Inventors: John Hopkins, Meridian, ID (US); Darwin Franseda Fan, Boise, ID (US); Fatma Arzum Simsek-Ege, Boise, ID (US); James Brighten, Boise, ID (US); Aurelio Giancarlo Mauri, Meda (IT); Srikant Jayanti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/610,755

(22) Filed: Jan. 30, 2015

(65) Prior Publication Data

US 2015/0140797 A1    May 21, 2015

Related U.S. Application Data

(62) Division of application No. 13/748,747, filed on Jan. 24, 2013, now Pat. No. 8,946,807.

(51) Int. Cl.

| H01L 29/788 | (2006.01) |
|---|---|
| H01L 27/115 | (2006.01) |
| H01L 29/423 | (2006.01) |
| H01L 29/66 | (2006.01) |
| H01L 29/40 | (2006.01) |

(Continued)

(52) U.S. Cl.
CPC .... *H01L 27/11582* (2013.01); *H01L 21/28035* (2013.01); *H01L 21/28273* (2013.01); *H01L 21/28282* (2013.01); *H01L 27/11556* (2013.01); *H01L 29/401* (2013.01); *H01L 29/42324* (2013.01); *H01L 29/518* (2013.01); *H01L 29/66825* (2013.01); *H01L 29/7889* (2013.01)

(58) Field of Classification Search
CPC ............... H01L 27/11582; H01L 27/11556; H01L 21/28273; H01L 21/28035; H01L 21/28282

See application file for complete search history.

(56) References Cited

U.S. PATENT DOCUMENTS

| 6,159,797 A | 12/2000 | Lee |
|---|---|---|
| 6,445,029 B1 | 9/2002 | Lam et al. |
| 6,583,009 B1 | 6/2003 | Hui et al. |

(Continued)

FOREIGN PATENT DOCUMENTS

| JP | 2012146773 A | 8/2012 |
|---|---|---|
| KR | 1020120101818 A | 9/2012 |

OTHER PUBLICATIONS

"International Application Serial No. PCT/US2014/012798, International Search Report mailed May 19, 2014", 3 pgs.

(Continued)

*Primary Examiner* — Ahmed Sefer

(74) *Attorney, Agent, or Firm* — Schwegman Lundberg & Woessner, P.A.

(57) ABSTRACT

Three-dimensional memory cells and methods of making and using the memory cells are discussed generally herein. In one or more embodiments, a three-dimensional vertical memory can include a memory stack. Such a memory stack can include memory cells and a dielectric between adjacent memory cells, each memory cell including a control gate and a charge storage structure. The memory cell can further include a barrier material between the charge storage structure and the control gate, the charge storage structure and the barrier material having a substantially equal dimension.

20 Claims, 22 Drawing Sheets

(51) Int. Cl.
  *H01L 21/28* (2006.01)
  *H01L 29/51* (2006.01)

(56) References Cited

U.S. PATENT DOCUMENTS

| | | |
|---|---|---|
| 7,369,436 B2 | 5/2008 | Forbes |
| 7,682,902 B2 | 3/2010 | Hsiao et al. |
| 7,910,446 B2 | 3/2011 | Ma et al. |
| 8,124,478 B2 | 2/2012 | Park et al. |
| 8,187,936 B2 | 5/2012 | Alsmeier et al. |
| 8,258,034 B2 | 9/2012 | Ramaswamy et al. |
| 8,946,807 B2 | 2/2015 | Hopkins et al. |
| 2005/0133851 A1 | 6/2005 | Forbes |
| 2006/0237768 A1 | 10/2006 | Forbes et al. |
| 2008/0253183 A1 | 10/2008 | Mizukami et al. |
| 2008/0277720 A1 | 11/2008 | Youn et al. |
| 2009/0121271 A1 | 5/2009 | Son et al. |
| 2010/0003795 A1 | 1/2010 | Park et al. |
| 2010/0163968 A1 | 7/2010 | Kim et al. |
| 2010/0200908 A1 | 8/2010 | Lee et al. |
| 2010/0240205 A1 | 9/2010 | Son et al. |
| 2011/0220987 A1 | 9/2011 | Tanaka et al. |
| 2011/0248334 A1 | 10/2011 | Sandhu et al. |
| 2012/0001247 A1 | 1/2012 | Alsmeier |
| 2012/0001249 A1 | 1/2012 | Alsmeier et al. |
| 2012/0058629 A1 | 3/2012 | You et al. |
| 2012/0132981 A1 | 5/2012 | Imamura et al. |
| 2012/0217564 A1 | 8/2012 | Tang et al. |
| 2013/0171788 A1* | 7/2013 | Yang .............. H01L 29/7827 438/268 |
| 2014/0203344 A1 | 7/2014 | Hopkins et al. |
| 2014/0264532 A1 | 9/2014 | Dennison et al. |

OTHER PUBLICATIONS

"International Application Serial No. PCT/US2014/012798, Written Opinion mailed May 19, 2014", 11 pgs.
"International Application Serial No. PCT/US2014/020658, International Search Report mailed Jun. 26, 2014", 3 pgs.
"International Application Serial No. PCT/US2014/020658, Written Opinion mailed Jun. 26, 2014", 4 pgs.
Hang-Ting, Lue, et al., "A Novel Planar Floating-Gate (FG) / Charge Trapping (CT) NAND Device Using BE-SONOS Inter-Poly Dielectric (IPD)", In proceeding of: Electron Devices Meeting (IEDM), (2009), 34.3:1-4.
Kitamura, Takuya, et al., "A Low Voltage Operating Flash Memory Cell with High Coupling Ratio", (1998).
Seo, Moon-Sik, et al., "The 3 dimensional Vertical FG NAND Flash Memory Cell Arrays with the Novel Electrical S/D/ Technique using the Extending Sidewall Contral Gate (ESCG)", 4 pages.

* cited by examiner

3D MEMORY

PRIORITY APPLICATION

This application is a divisional of U.S. application Ser. No. 13/748,747, filed Jan. 24, 2013, which is incorporated herein by reference in its entirety.

BACKGROUND

Some memory cells can include a floating gate and a nitride wrapped around three sides of the floating gate. Undesired charges may become trapped in the nitride, particularly in portions of the nitride that are not directly between the control gate and the floating gate. The threshold voltage ($V_t$) of a cell may be altered by the undesired charges trapped in the nitride.

DESCRIPTION OF THE EMBODIMENTS

Figure 1:
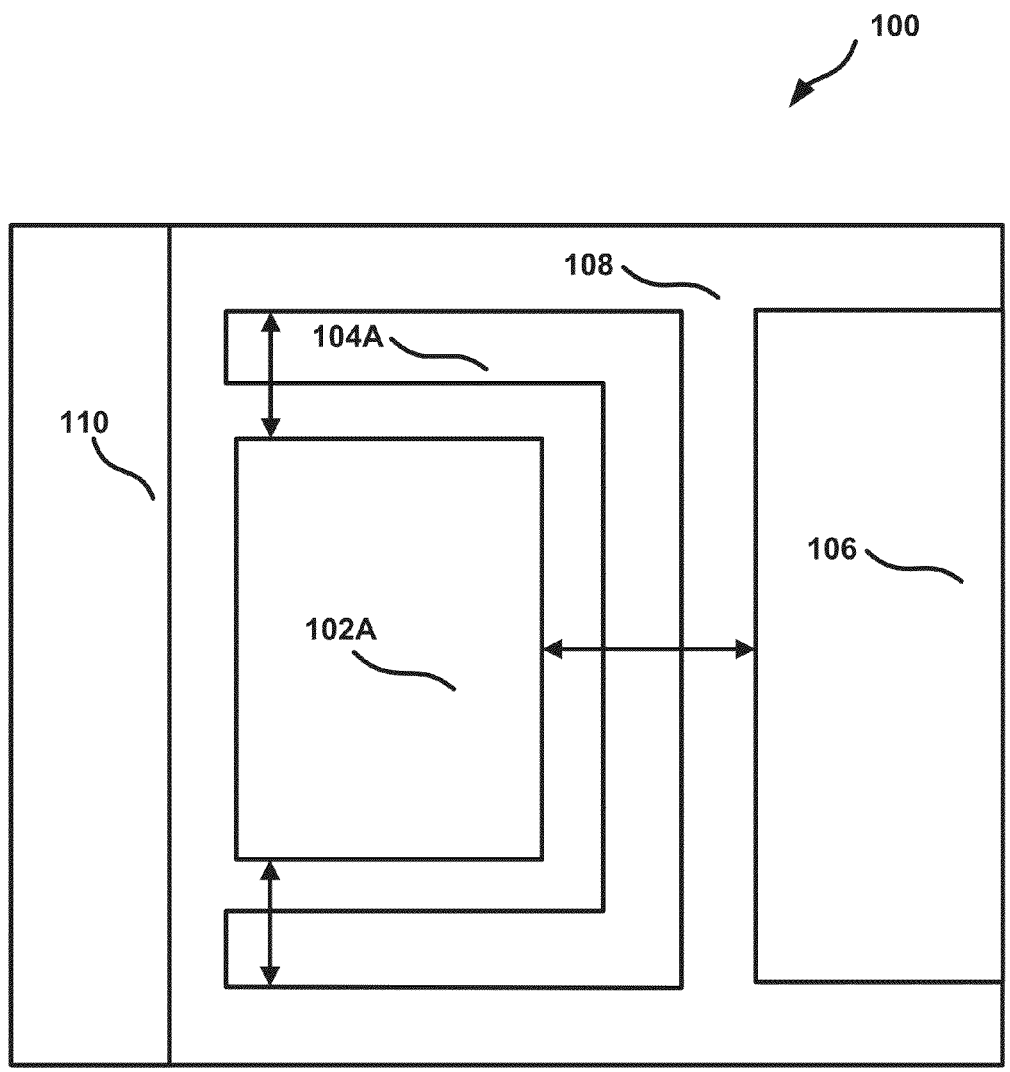
FIG. 1 illustrates a cross-section view of an example of a memory cell with an inter-gate dielectric (IGD) partially wrapped around a floating gate.

The following detailed description refers to the accompanying drawings which show, by way of illustration, specific aspects and embodiments in which the present subject matter may be practiced. These embodiments are described in sufficient detail to enable those skilled in the art to practice the present subject matter.

The term "horizontal" as used in this application is defined as a plane parallel to the conventional plane or surface of a wafer, such as a substrate, regardless of the actual orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the actual orientation of the wafer or substrate. The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the present invention is defined only by the appended claims, along with the full scope of equivalents to which such claims are entitled.

Generally discussed herein are three-dimensional (3D) memories, memory cells, and methods of making and using the same. In one or more embodiments, a 3D vertical memory can include a memory stack. A memory stack can include a stack of at least two memory cells and a dielectric between adjacent memory cells, where each memory cell includes a control gate (CG) and a charge storage structure, such as a floating gate (FG) or charge trap (CT), configured to store electrons or holes accumulated on it. Information is represented by the amount of electrons or holes stored by the cell. The memory stack can further include a barrier material, such as nitride in an inter-gate dielectric (IGD) comprising a composite of oxide-nitride-oxide ("ONO"), where the IGD can be between the charge storage structure and the CG. The barrier material and the charge storage structure can be laterally positioned adjacent, horizontally aligned to each other, or have substantially equal heights.

A NAND array architecture is an array of memory cells arranged such that the memory cells of the array are coupled in logical rows to access lines (which are coupled to, and in some cases are at least partially formed by, the CGs of the memory cells), which are conventionally referred to as word lines. Some memory cells of the array are coupled together in series between a source line and the data line, which is conventionally referred to as a bit line.

Memory cells in NAND array architecture can be programmed to a desired data state. For example, electric charge can be accumulated (e.g., placed) on, or removed from, an FG of a memory cell to program the cell into a desired one of a number of data states. A memory cell conventionally referred to as a single level cell (SLC) can be programmed to a desired one of two data states, e.g., a "1" or a "0" state. Memory cells conventionally referred to as multilevel cells (MLCs) can be programmed to a desired one of more than two data states.

When electrons are stored on the FG, they modify the $V_t$ of the cell. Thus, when the cell is "read" by placing a specific voltage on the CG (e.g., by driving the access line coupled to the cell with a read voltage), electrical current will either flow or not flow in the cell's channel depending on the $V_t$ of the cell and the specific voltage placed on the CG. This presence or absence of current can be sensed and translated into 1's and 0's, reproducing the stored data.

Each memory cell may not directly couple to a source line and a data line. Instead, the memory cells of an example array may be arranged together in strings, typically of 4, 8, 16, 32, or more cells each, where the memory cells in the string are coupled together in series between a common source line and a data line.

A NAND array can be accessed by a row decoder activating a row of memory cells by driving the access line coupled to those cells with a voltage. In addition, the access lines coupled to the unselected memory cells of each string can be driven with a different voltage. For example, the unselected memory cells of each string can be driven with a pass voltage so as to operate them as pass transistors, allowing them to pass current in a manner that is unrestricted by their programmed data states. Current can then flow from the source line to the data line through each memory cell of the series coupled string, restricted by the memory cell of each string that is selected to be read. This places the currently encoded, stored data values of the row of selected memory cells on the data lines. A page of data lines is selected and sensed, and then individual data words can be selected from the sensed data words from the page and communicated from the memory apparatus.

The flash memory, such as a NAND array, may be formed as a 3D memory with stacks of more than one memory cells. The CGs for the memory cells may be adjacent to CG recesses.

FIG. 1 shows an example of a memory cell 100 from a stack of memory cells within a 3D memory that can include a charge storage structure, such as FG 102A, a dielectric (e.g., oxide) 108, a barrier film (e.g., nitride) 104A, a CG 106, and a pillar 110. In the illustrated example, the barrier film 104A is between the FG 102A and the CG 106. The barrier film 104A can be substantially rectilinear as generally illustrated, but may not be substantially rectangular. Charge can get trapped on portions of the barrier film 104A, such as on portions of the barrier film 104A that do not directly separate the FG 102A and the CG 106.

Figure 2:
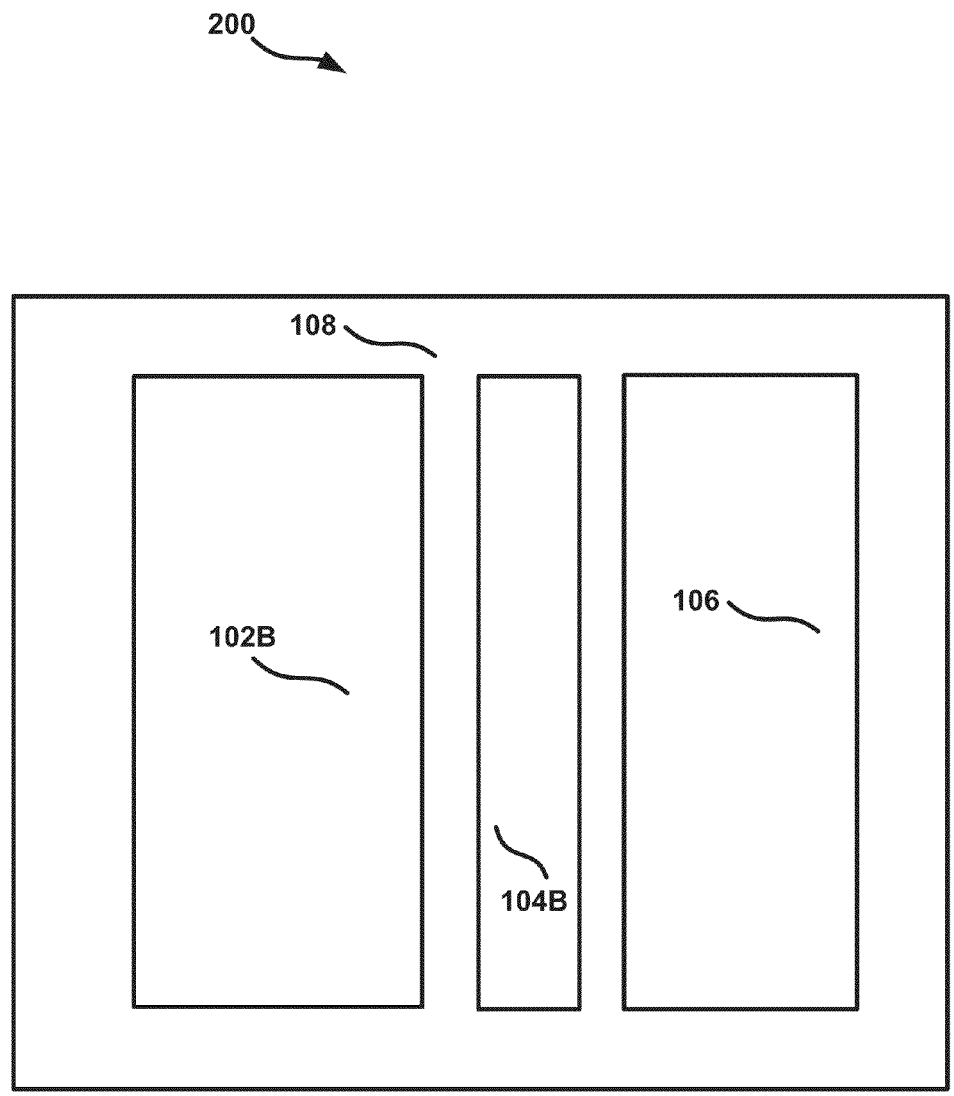
FIG. 2 illustrates a cross-section view of an example of a memory cell.

FIG. 2 shows a cross-section view of an example of a vertical memory cell 200. The memory cell 200 can include an FG 102B, a dielectric 108, a barrier film 104B, and a CG 106. The vertical memory cell 200 can be used in a NAND string, NOR string, or other type of string. The barrier film 104 can be substantially rectangular, as illustrated in FIG. 2.

Figure 3:
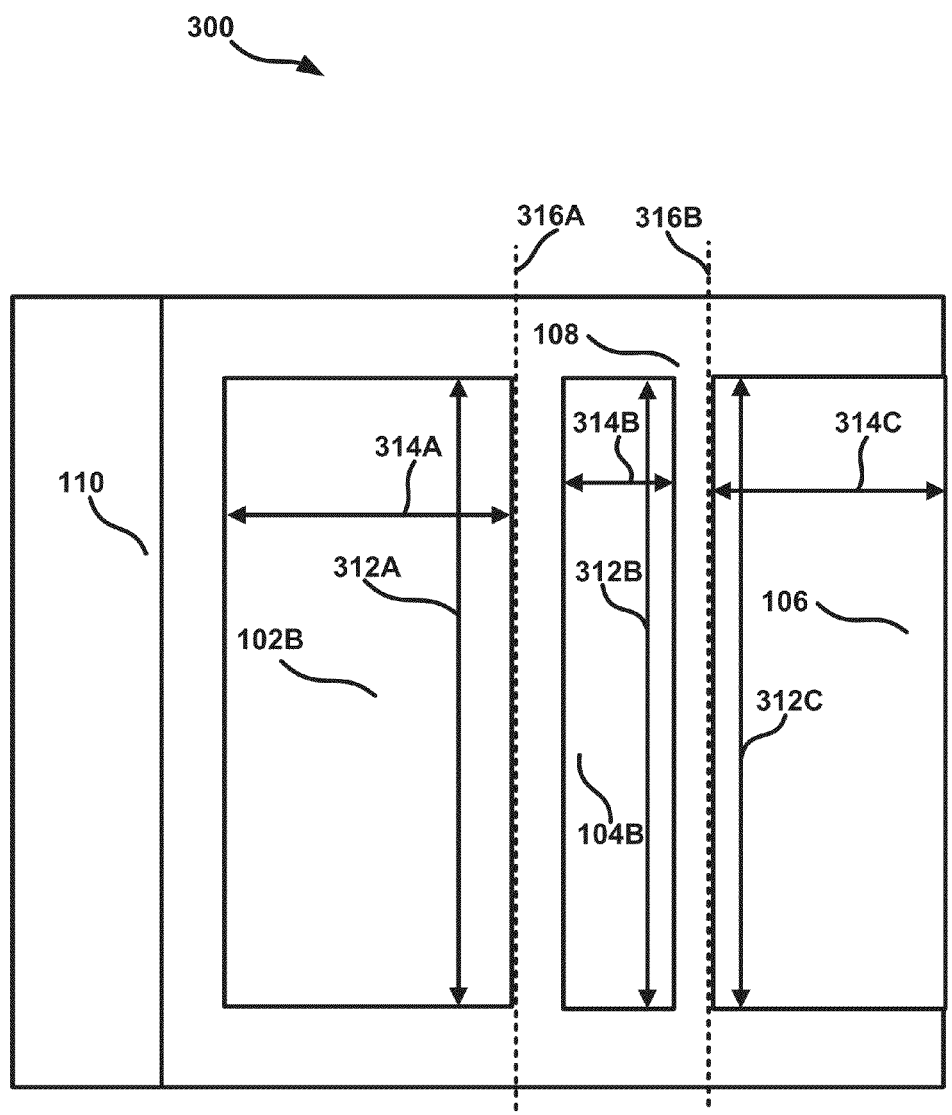
FIG. 3 illustrates a cross-section view of an example of a memory cell.

FIG. 3 shows a cross-section view of an example of a memory cell 300, such as a vertical memory cell, that can include an FG 102B, a barrier film 104B, a CG 106, a dielectric 108, and a semiconductor pillar 110. The FG 102B can be made of a semiconductor material, such as conductively doped polysilicon. The FG 102B can have a first dimension 312A (e.g., height) that is substantially equal to a first dimension 312B of the barrier film 104B (e.g., within one or two times a standard variation in a fabrication process used to make the memory cell), such as shown in FIG. 3. The first dimension 312A of the FG 102B could also be greater than a first dimension 312B of the barrier film 104B. The FG 102B can have a second dimension (e.g., length) 314A perpendicular to the first dimension 312A that is greater than the second dimension 314B of the barrier film 104B through the entire first dimension 312A of the FG 102B, such as shown in FIG. 2. The first dimension 312A of the FG 102B can be smaller than the first dimension 312C of the CG 106 or substantially equal to the first dimension 312C of the CG 106. The second dimension 314C of the CG 106 can be greater than the second dimension 314A of the FG 102B through the entire first dimension 312A of the FG 102B. The CG 106, oxide 108, FG 102, or barrier film 104 can be deposited using a PECVD process.

The barrier film 104B can include a second dimension 314B that is substantially equal through its first dimension 312B (e.g., the barrier film 104B can include a substantially uniform thickness across its entire first dimension 312B), such as shown in FIG. 3. The barrier film 104B can be substantially rectangular in a vertical cross-section of the vertical memory cell 300, such as shown in FIG. 3. The barrier film 104B can include a surface area (e.g., second dimension 314B times first dimension 312B) that is less than a surface area of the FG 102B (e.g., second dimension 314A times first dimension 312A), such as shown in FIG. 3. The barrier film 104B can be entirely between a plane 316A corresponding to a side of the FG 102B and a plane 316B corresponding to a side of the CG 106 opposing the side of the FG 102B, such as shown in FIG. 3. The barrier film 104B can be adjacent to only one side of the FG 102B, such as shown in FIG. 3.

The barrier film 104B can include a face and the FG 102B can have a face, such as the face corresponding to the plane 316A, opposing the face of the barrier film 104B and substantially parallel to the face of the barrier film 104B. Each part of the face of the barrier film 104B can be separated from the face of the floating gate 102B by a substantially equal distance, such as shown in FIG. 3.

The FG 102B can have a planar side (e.g., the side corresponding to the plane 316A) facing the barrier film 104B. The CG 106 can have a planar side (e.g., the side corresponding to the plane 316B) facing the barrier film 104B. The barrier film 104B can have a first planar side facing and substantially parallel to the planar side of the FG 102B and a second planar side facing and substantially parallel to the planar side of the CG 106. The first dimension 312C of the CG 106 can be substantially equal to the corresponding first dimension 312B of the barrier film 104B, such as shown in FIG. 3.

Figure 4:
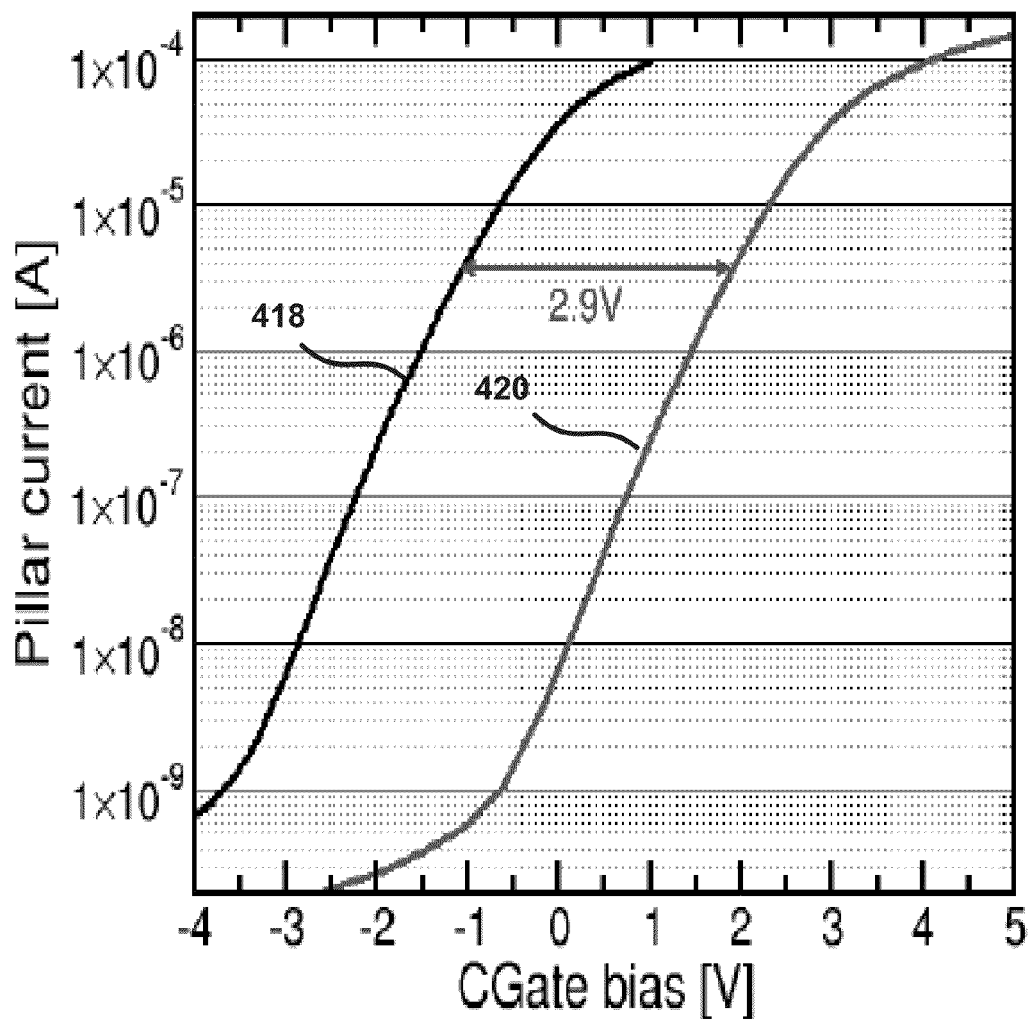
FIG. 4 illustrates, by way of example, a graph of control gate bias voltage vs. pillar current in different memory cells.

FIG. 4 shows an example of a graph of CG bias vs. pillar current. Line 418 is an example of a CG bias vs. pillar current in a memory cell that includes a barrier film 104 such as the barrier film 104B shown in FIG. 2. Line 420 is an example of a CG bias vs. pillar current in a cell that includes a barrier film 104 adjacent to the FG 102 on three sides, such as shown in FIG. 1. For the same pillar current, the CG 106 bias for line 418 can be less than the CG 106 bias for line 420. For example, as illustrated in FIG. 4, the bias voltage difference may be about 2.9 Volts. Other voltage differences can be realized. For example, the bias voltage difference may be up to about 7 Volts. The voltage differences can be a function of how much charge is trapped on the barrier film 104 or the alignment of the FG 102 to the CG 106. For example, the lower CG bias can be due, at least in part, to a reduction in the amount of charge trapped on the barrier film 104B as compared to the charge trapped on the barrier film 104A. Also, the lower CG bias can be due, at least in part, to the alignment between the FG 102B and the CG 106.

As used herein, "vertical memory string" can mean a "vertical memory stack" (e.g., alternating CG 106 and tier dielectric 524 layers with CG recesses 530 between tier dielectric 524 layers) with a CG recess 530 filled in with dielectric 108, an FG 102, and barrier film 104, and including a pillar 110 (e.g., a filled trench 528, such as a trench filled with polysilicon). Also, the term "vertical memory" can be used to indicate a final form.

Figure 5A:
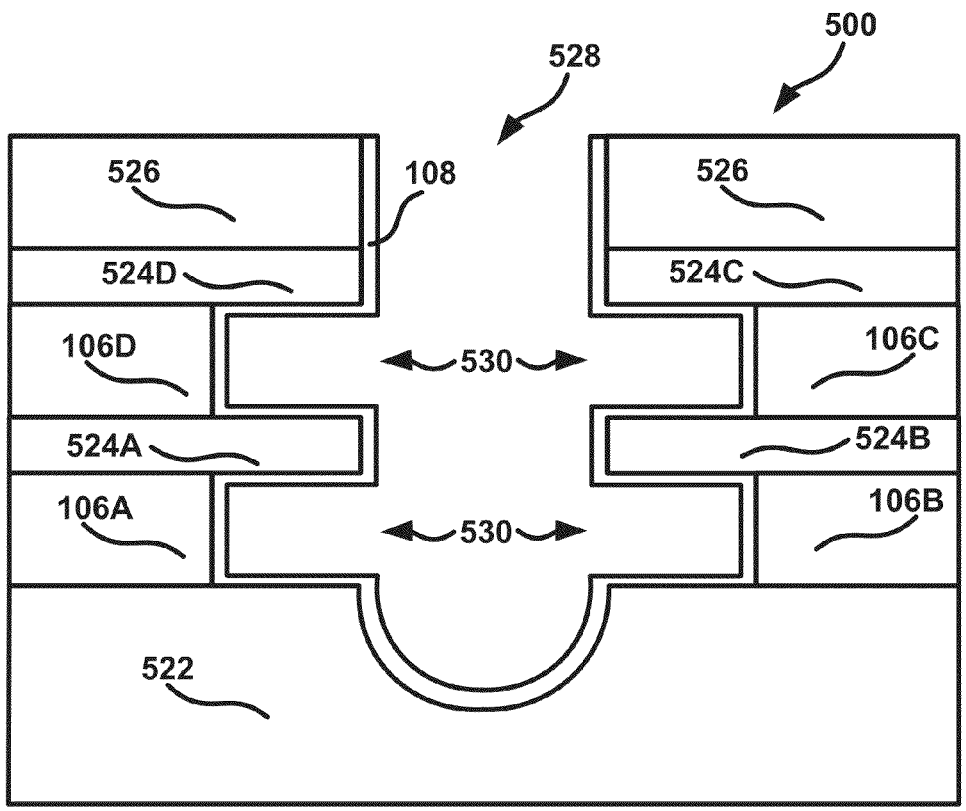
FIGS. 5A-G illustrate an example of a technique of making a vertical memory.

FIGS. 5A-G show an example of a technique of making a vertical memory 500 with a planar barrier film 104. FIG. 5A shows a first CG 106A-B over a substrate 522, a first tier dielectric 524A-B over the first CG 106A-B, a second CG 106C-D over the first tier dielectric 524A-B, a second tier dielectric 524C-D over the second CG 106C-D, and a mask material (e.g., dielectric, such as oxide, nitride, or polysilicon) 526 over the second tier dielectric 524C-D. The vertical memory 500 can include a trench 528 and a plurality of CG recesses 530. A first layer of dielectric 108, such as oxide, can be formed on the sidewalls of the trench 528 and on exposed surfaces of the CGs 106 in the CG recesses 530, such as shown in FIG. 5A. The CG recesses 530 can be gaps between tier dielectric layers 524 adjacent to the CGs 106 formed between the tier dielectric layers 524.

Figure 5B:
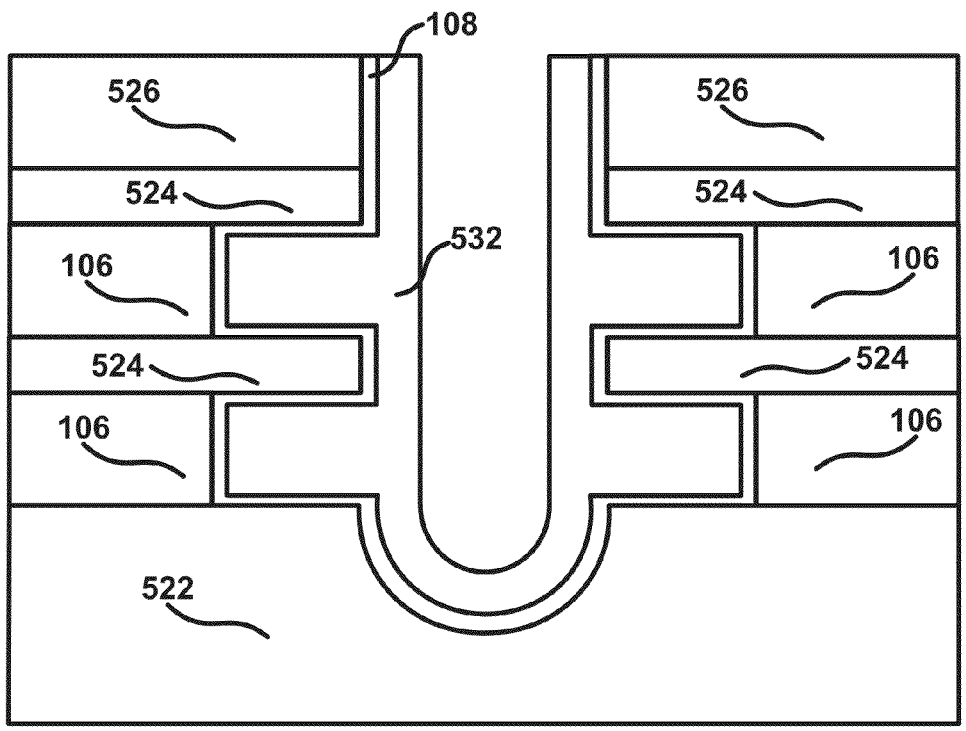
Figure 5C:
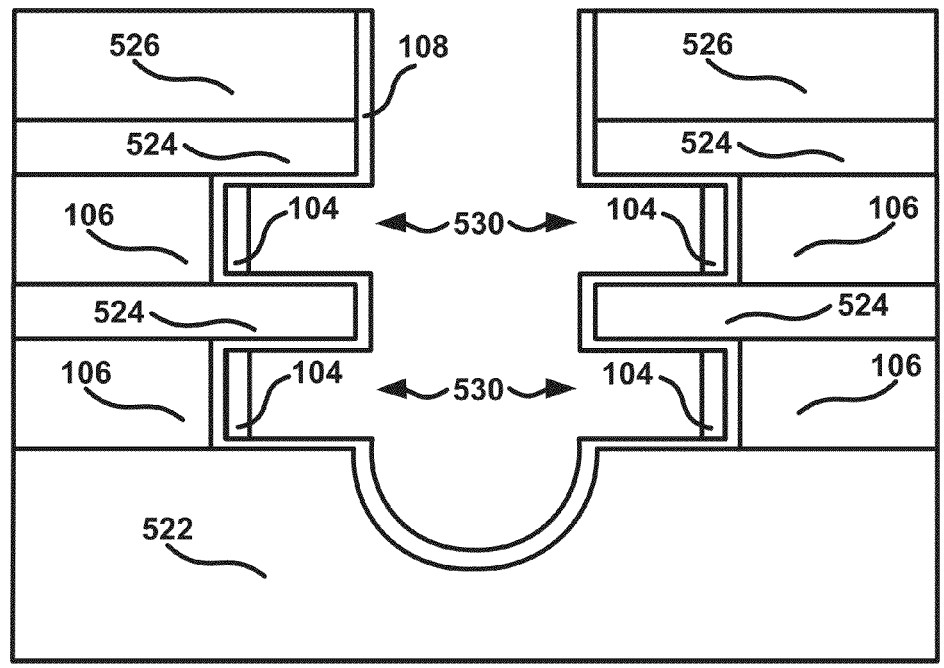

The trench 528 and the CG recesses 530 can be at least partially filled with a barrier material 532, such as shown in FIG. 5B. For example, the barrier material 532 can be nitride. The barrier material 532 may be deposited or otherwise formed in the trench 528 and CG recesses 530. The barrier material 532 can be partially removed, such as by using a mechanical, chemical, laser, vapor, or photo etching process. The barrier material 532 can be partially removed from the trench 528 and CG recesses 530 to leave at least some of the barrier material 532 in the CG recesses 530 to form barrier films 104 adjacent to the CGs 106, such as shown in FIG. 5C. The portions of the barrier material 532 removed can be removed using hot phosphoric acid. The size or shape of the barrier material 532 remaining after the process can be controlled by using hot phosphoric acid at different temperatures or concentrations, or by exposing the barrier material 532 to the hot phosphoric acid for varying amounts of time.

Figure 5D:
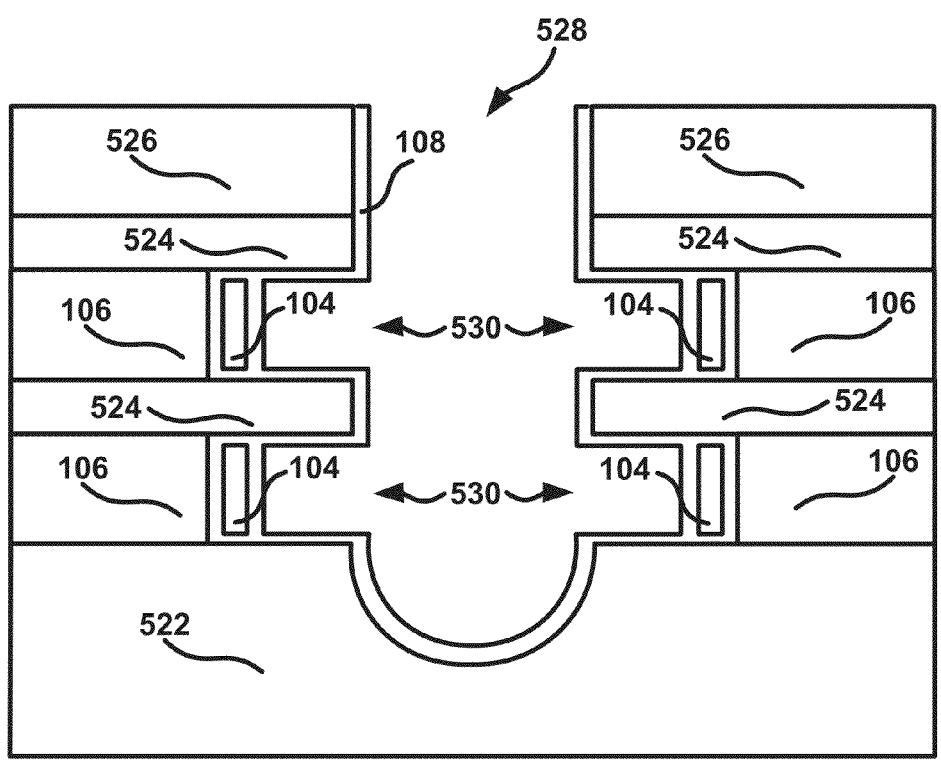
Figure 5E:
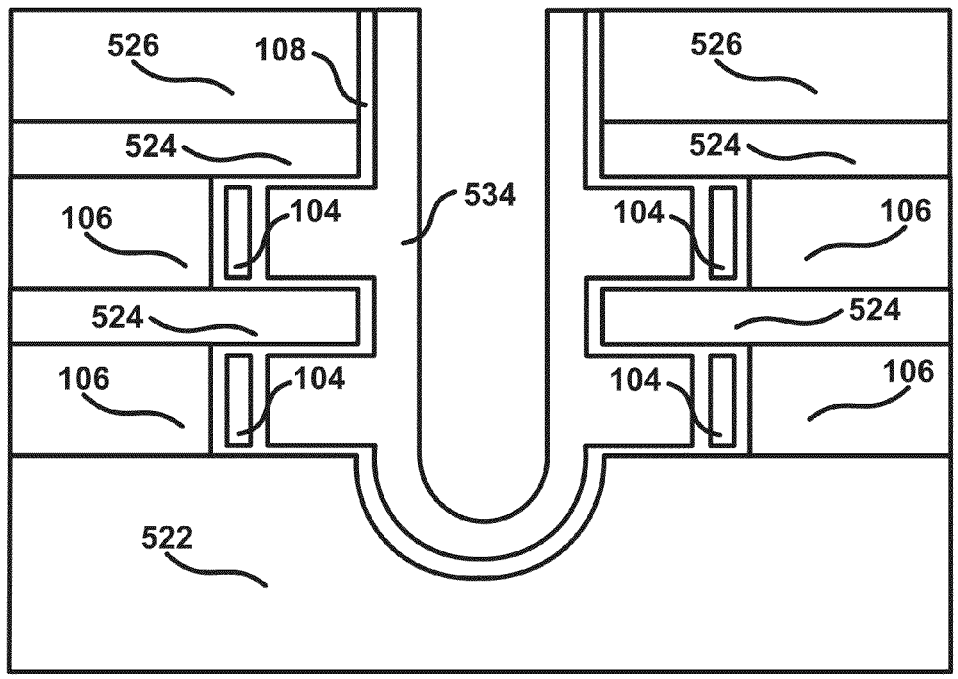
Figure 5F:
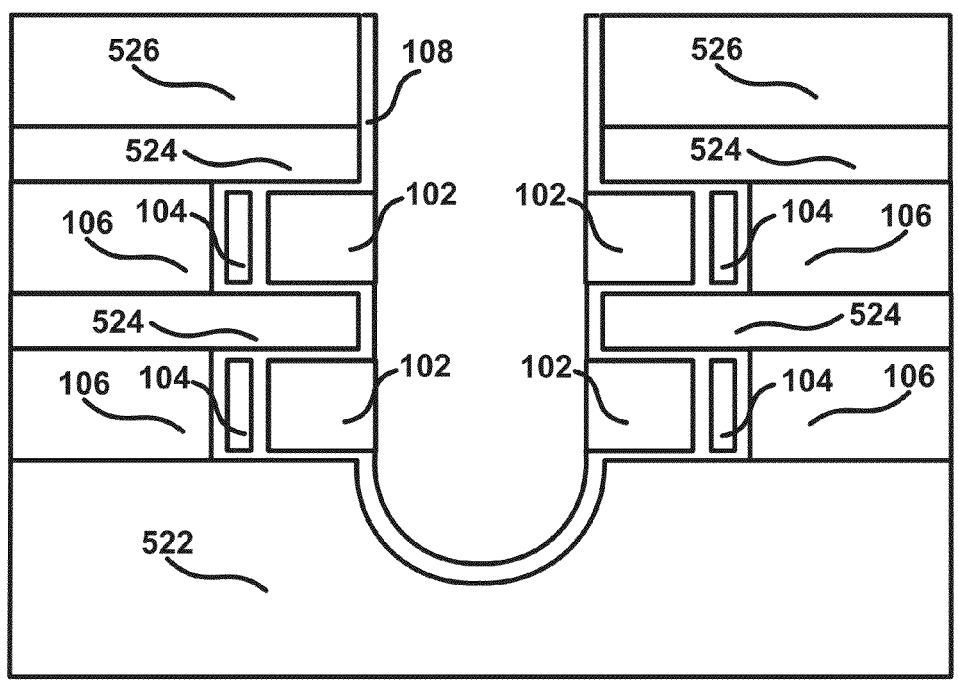

A second layer of dielectric 108 (which may or may not be the same dielectric material as the first layer) can be formed, such as by growing the dielectric 108 using an in situ steam generation process (ISSG), on the barrier films 104, such as shown in FIG. 5D. The trench 528 and the CG recesses 530 can be at least partially filled with a charge storage material 534, such as shown in FIG. 5E. The charge storage material 534 may be conductively doped polysilicon. The charge storage material 534 may be deposited to at least partially fill the CG recesses 530. The charge storage material 534 can be at least partially removed, such as shown in FIG. 5F. The charge storage material 534 may be at least partially removed from the trench 528 and CG recesses 530, and remaining portions of the charge storage material 534 may be left in the CG recesses 530, such as to form FGs 102. The portions of charge storage material 534 can be removed using a Certas™ (e.g., a vapor ammonia), an ammonium fluoride and nitric acid mix (NH4F—HNO3), an ozone (O3) or hydrofluoric acid (HF) mix or cycle (e.g., exposed surfaces can be exposed to ozone to create oxide (e.g., oxidize) the surface and the oxidized surface can be exposed to hydrofluoric acid to remove the oxide), hydrofluoric acid and nitric acid mix (HF—HNO3), hydrofluoric acid and hydrogen peroxide mix (HF—H2O2), or a tetra methyl ammonium hydroxide (TMAH) process. The process used to remove portions of charge storage material 534 can be a function of the doping of the charge storage material 534. For example, if the charge storage material 534 is n-type polysilicon, the TMAH process can be used to remove the portions of charge storage material 534.

Figure 5G:
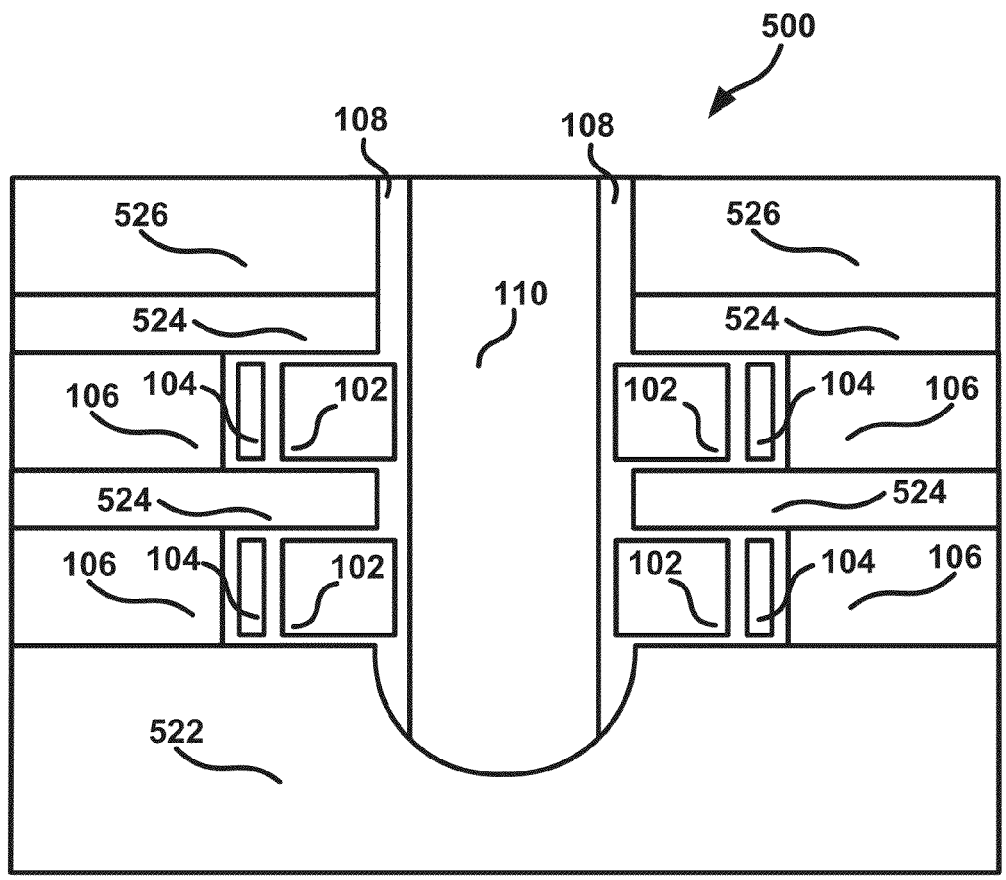

A third layer of dielectric 108, such as a tunnel oxide, can be formed (e.g., grown) on the FGs 102, and a pillar 110 can be formed in the trench 528, such as shown in FIG. 5G. Forming a pillar 110 can include forming a liner, such as a polysilicon liner, on exposed surfaces of the trench 528, such as the sidewalls of the trench 528. The liner can protect or shield the dielectric 108 from a downstream process. The dielectric 108 (e.g., poly liner) in the bottom of the trench 528 can be punched through or otherwise removed, such as to allow electrical contact to the substrate 522 or channel 1138 (see FIG. 11). As shown in FIG. 5G, the pillar 110 can be formed to at least partially fill the trench 528. The vertical memory 500 formed by the technique can include a memory cell substantially similar to the vertical memory cell 300 shown in FIG. 3 with the first dimension 312A of the FG 102 and the first dimension 312B of the barrier film 104 less than the first dimension 312C of the CG 106. FIG. 5G shows a vertical memory 500 with two vertical memory strings, each vertical memory string including two memory cells.

Figure 6A:
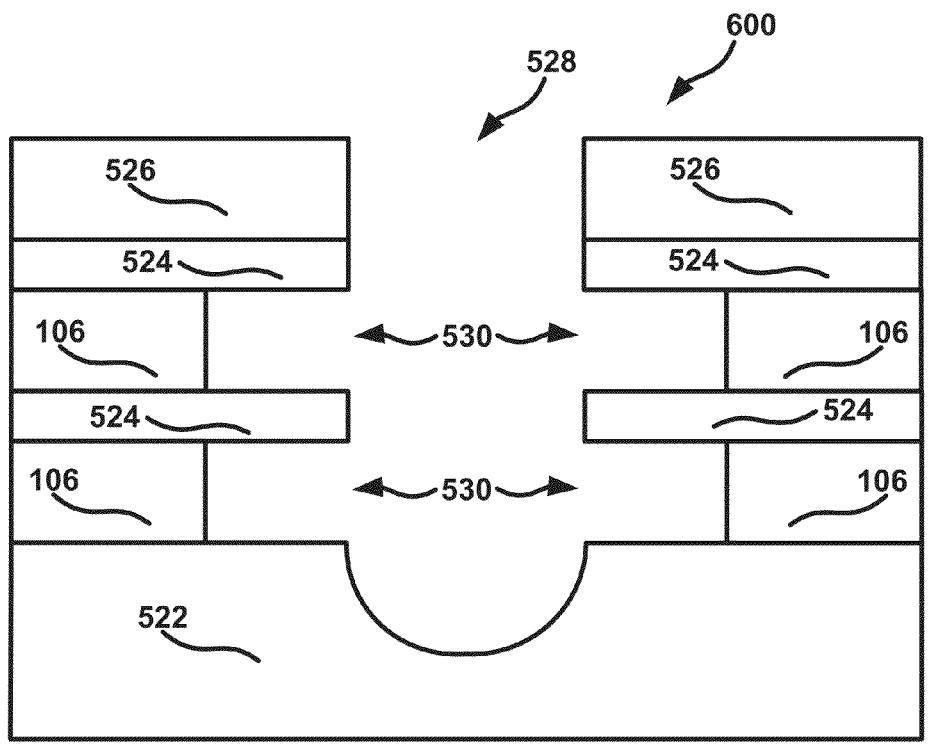
FIGS. 6A-K illustrate another example of another technique of making a vertical memory.
Figure 6B:
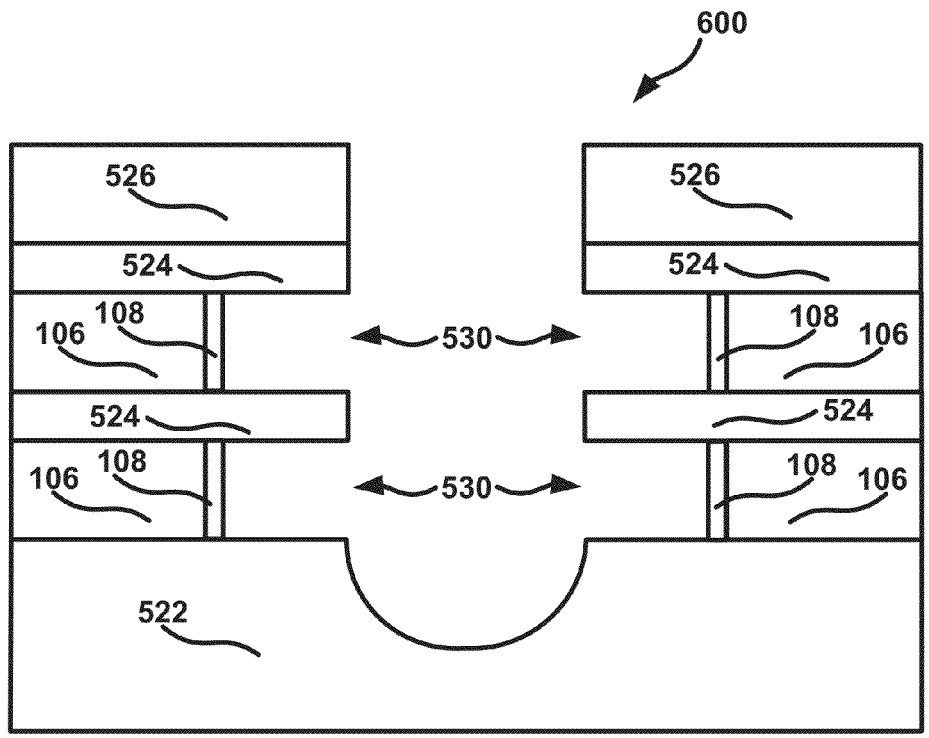
Figure 6C:
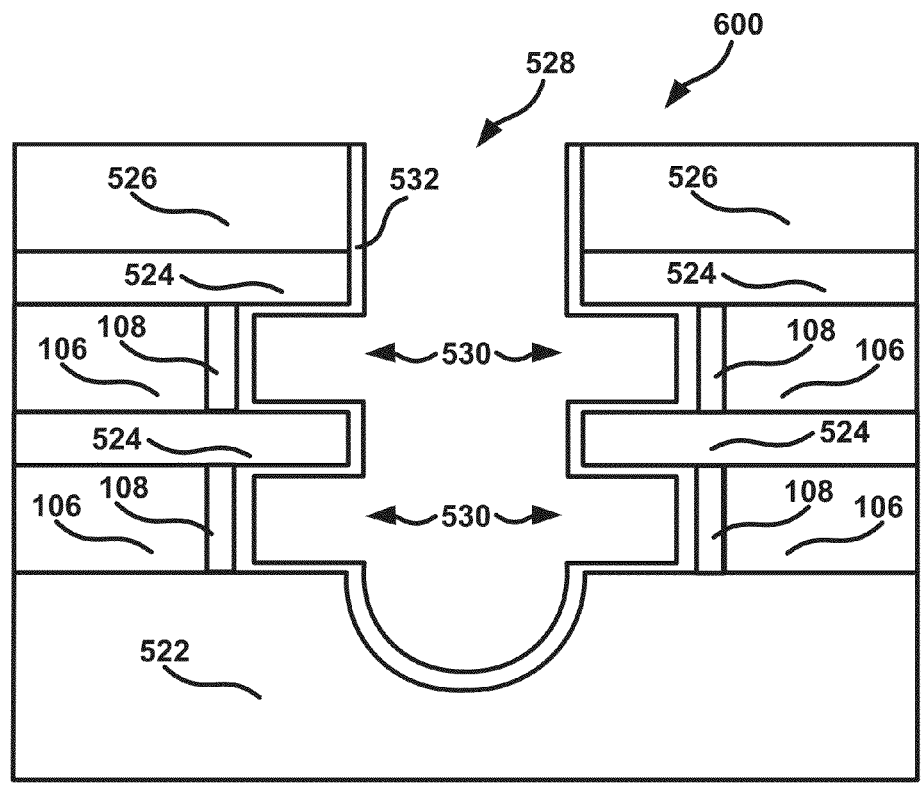

FIGS. 6A-J show an example of a technique of making a vertical memory 600. The vertical memory 600 in FIG. 6A can be substantially similar to the vertical memory 600 shown in FIG. 5A without the dielectric 108. A layer of dielectric 108 can be formed on the sidewalls of the trench 528 and on exposed surfaces of the CGs 106 adjacent to the recesses 530. As shown in FIG. 6B, portions of the dielectric 108 can be removed, such as by using hydrofluoric acid, from the sidewalls of the trench 528 and portions of exposed surfaces of the CG recesses 530. Alternatively, the dielectric 108 can be grown on exposed portions of the CG 106, such as through an In Situ Steam Generation (ISSG) process. Such a technique can leave a dielectric 108 adjacent to the CG 106 in a respective CG recess 530 that has a dimension (e.g., height) that is substantially equal to a corresponding dimension (e.g., height) of the CG 106. The trench 528 and the CG recesses 530 can be at least partially filled with a barrier material 532 to provide barrier material 532 on exposed surfaces of the CG recesses 530 and sidewalls of the trench 528, such as shown in FIG. 6C.

Figure 6D:
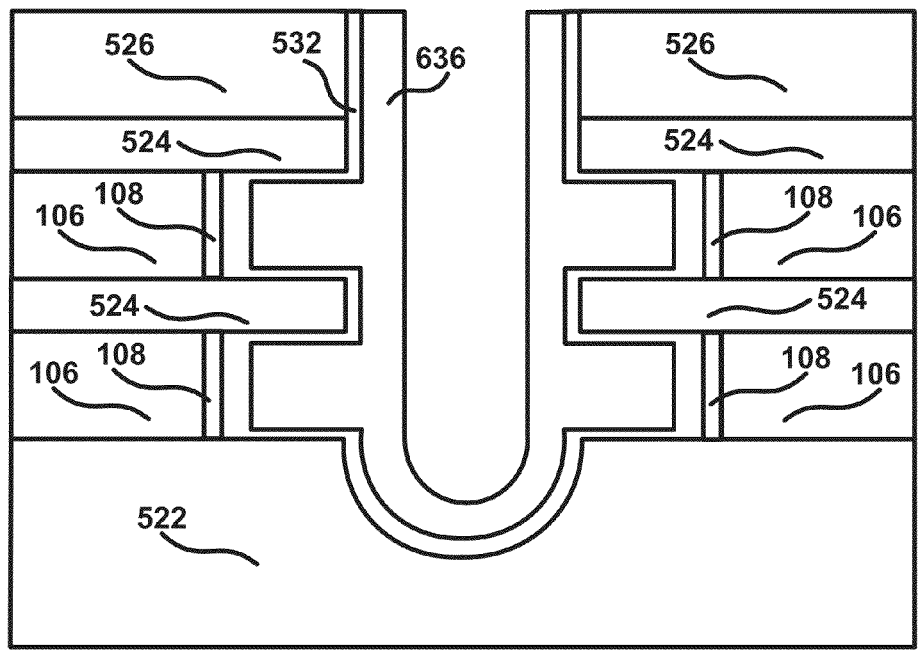
Figure 6E:
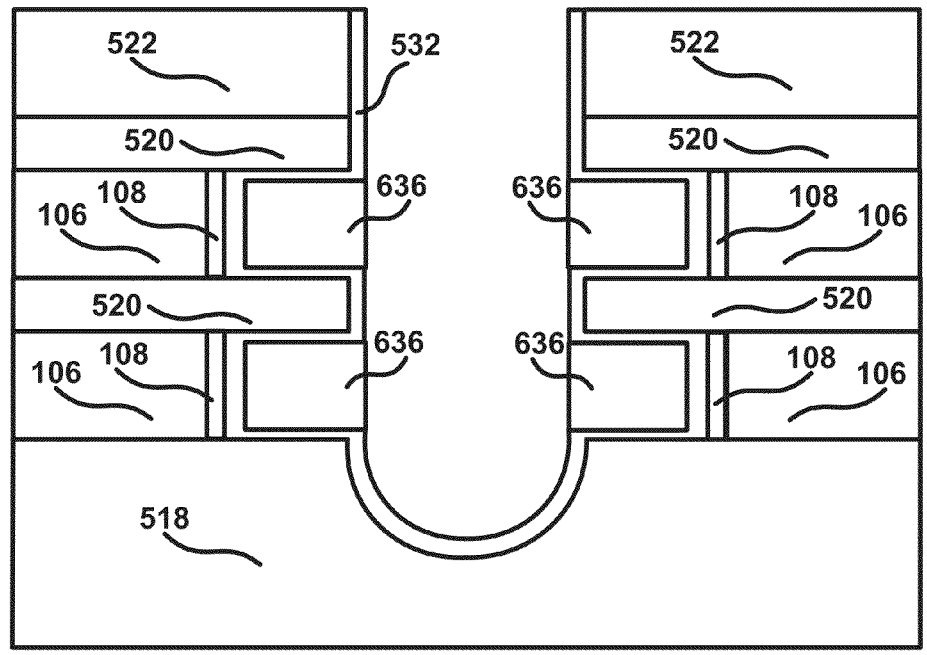

The trench 528 and the CG recesses 530 can be at least partially filled with a sacrificial material 636. As shown in FIG. 6D, the sacrificial material 636 can be deposited or otherwise formed on the barrier material 532 in the trench 528 and CG recesses 530. The sacrificial material 636 can be deposited using an Atomic Layer Deposition (ALD) process, High Aspect Ratio Process (HARP), or other process. The sacrificial material 636 can be a polysilicon, oxide, Tetraethyl Orthosilicate (TEOS), an organic, such as carbon Bottom Anti-Reflective Coating (BARC) or resist, nitride, doped versions thereof, or combinations thereof. A sacrificial material 636 can be useful in techniques where a downstream process, such as phosphoric acid barrier material removal, can damage the material that would otherwise become the FG 102 if the sacrificial material 636 were not used. The sacrificial material 636 can be at least partially removed from the trench 528, leaving some sacrificial material 636 in the CG recesses 530, such as shown in FIG. 6E. When the sacrificial material 636 comprises polysilicon a TMAH, ammonia (NH4OH), or vapor ammonia process can be used to at least partially remove the sacrificial material 636. When the sacrificial material 636 comprises an oxide or nitride deposited by means of an ALD or other process, hydrofluoric acid or hot phosphoric acid can be used to at least partially remove the sacrificial material 636. When the sacrificial material 636 comprises TEOS or a HARP material hydrofluoric acid can be used to at least partially remove the sacrificial material 636. When the sacrificial material comprises BARC or resist an anisotropic dry etch or plasma dry strip (e.g., "descum") can be used to at least partially remove the sacrificial material 636.

Figure 6F:
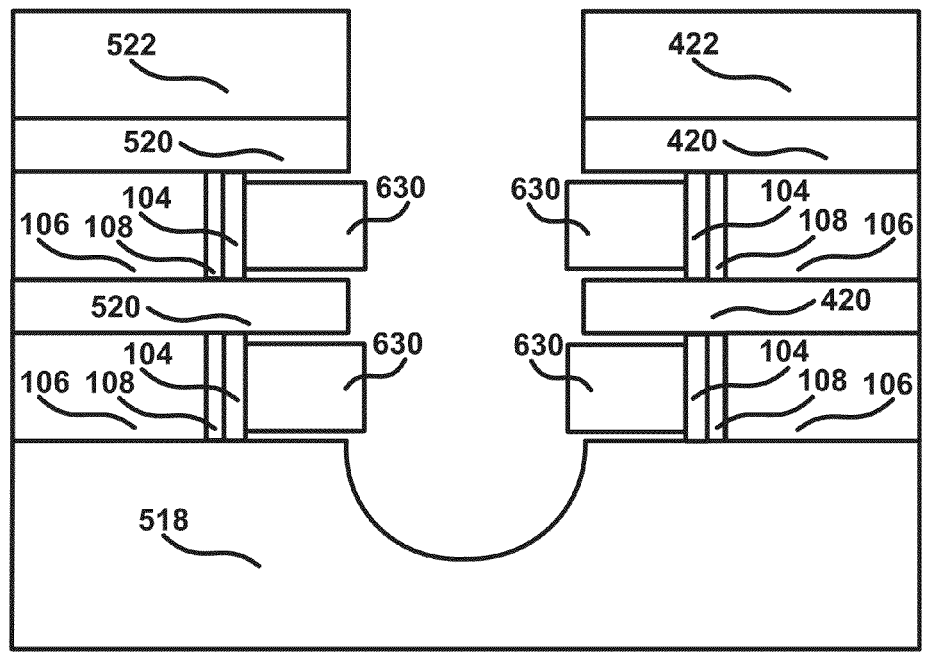
Figure 6G:
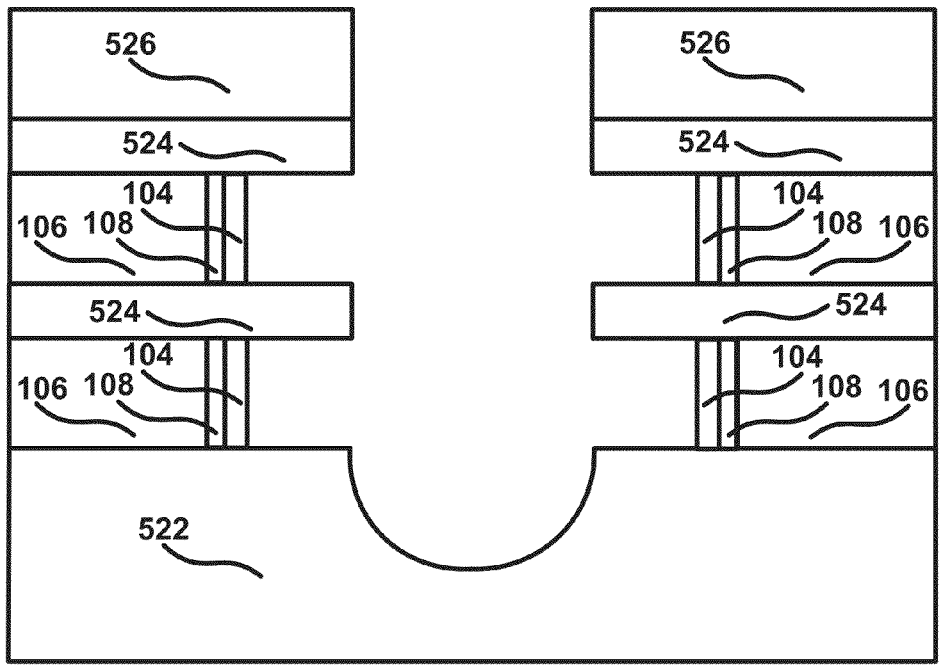

The barrier material 532 can be etched to at least partially remove the barrier material 532 from the trench 528 and the CG recesses 530. As shown in FIG. 6F, the etching can form a barrier film 104 adjacent to the dielectric 108 in a respective CG recess 530 that has a dimension (e.g., height) that is substantially equal to a corresponding dimension (e.g., height) of the CG 106 adjacent to that recess 530. The sacrificial material 636 can be resistant to a removal process such as to be protected from the removal process. The removal process can include a chemical etch that includes a chemical, such as hot phosphoric acid, that selectively removes portions of the barrier material 532 and does not remove the dielectric 108 or other portions of the vertical memory 600. The sacrificial material 636 can be removed, such as shown in FIG. 6G.

Figure 6H:
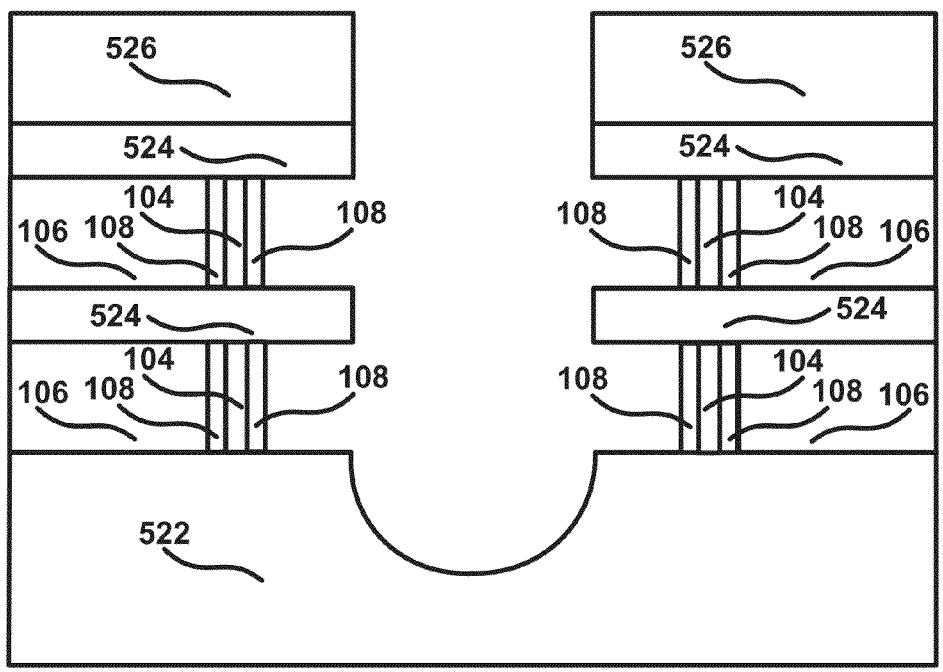

A second layer of dielectric 108 can be grown on exposed surfaces of the barrier films 104, such as shown in FIG. 6H. The grown dielectric 108 in a respective CG recess 530 can have a dimension (e.g., height) substantially equal to a corresponding dimension (e.g., height) of the CG 106 adjacent to that recess 530.

Figure 6I:
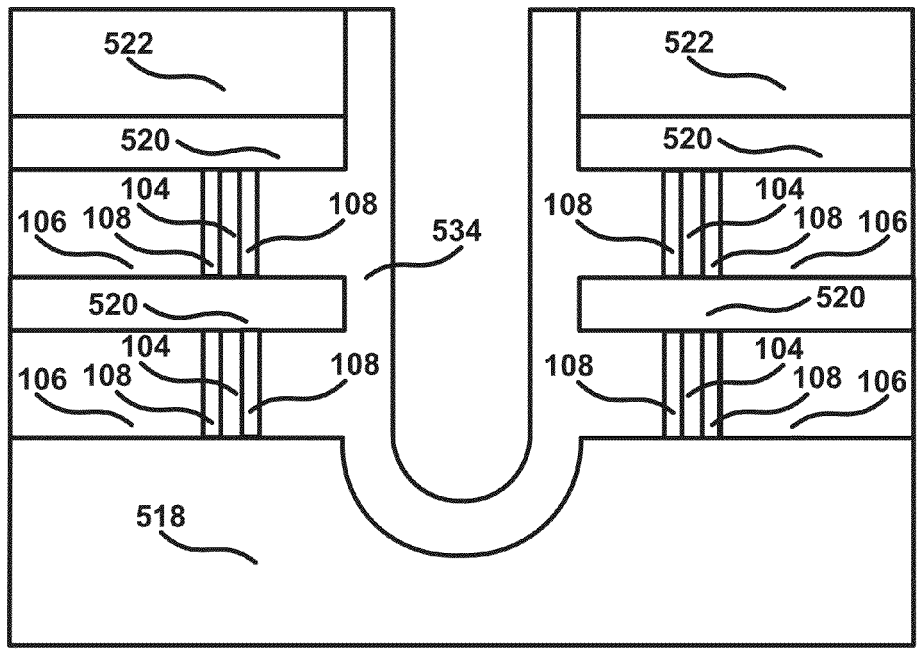
Figure 6J:
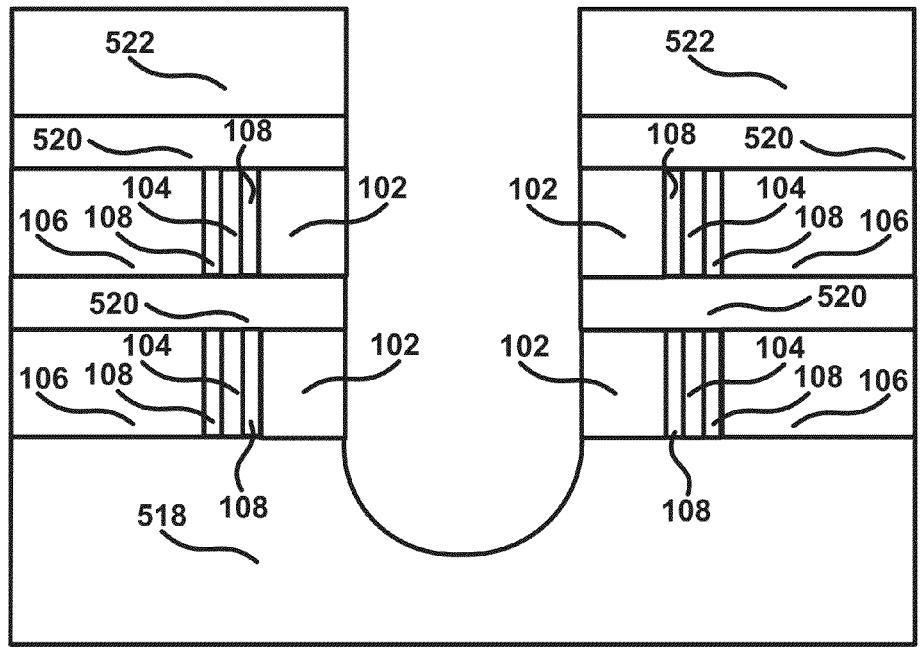
Figure 6K:
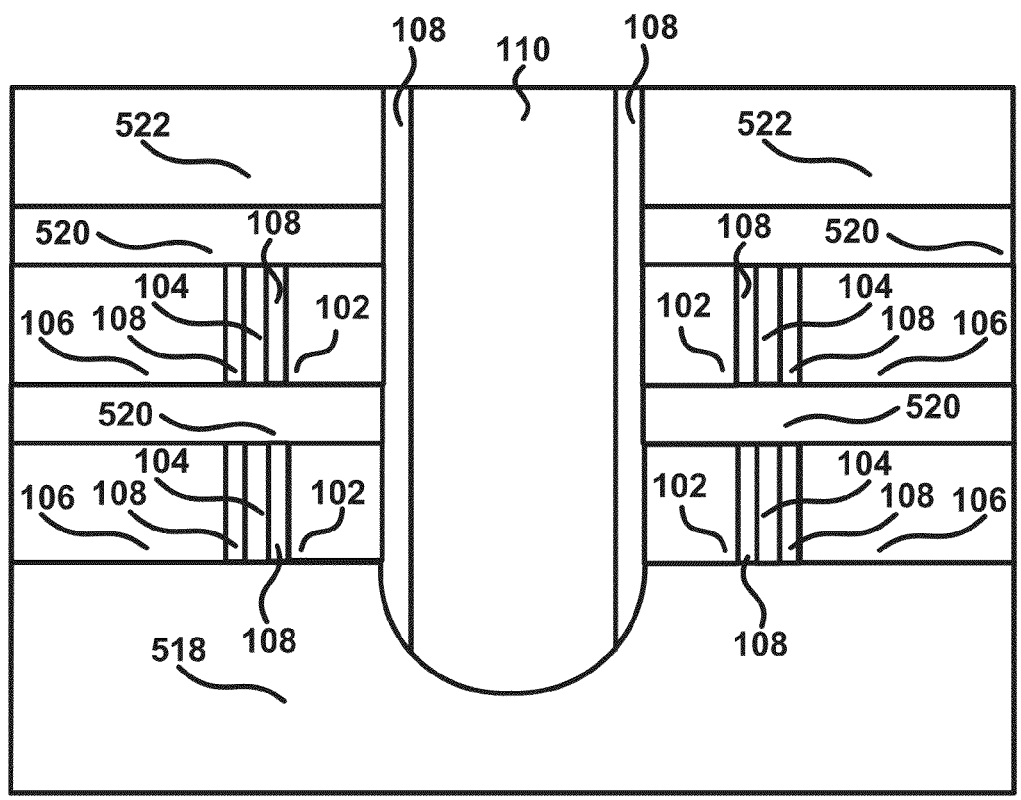

The trench 528 and the CG recesses 530 can be at least partially filled with a charge storage material 534, such as shown in FIG. 6I. The trench 528 and the CG recesses 530 can be filled using a conformal deposition process. The charge storage material 534 can be at least partially removed from the trench 528 and CG recesses 530. Some charge storage material 534 can be left in the CG recesses 530. The charge storage material 534 that is left can form FGs 102. The FG 102 in a respective CG recess 530 can have a dimension (e.g., height) that is substantially equal to a corresponding dimension (e.g., height) of a CG 106 adjacent to that CG recess 530, such as shown in FIG. 6J. As shown in FIG. 6K, a third layer of dielectric 108 (which may or may not be the same type of dielectric used in the first and/or second layer) and a pillar 110 can be formed (e.g., grown) in the trench 528. The vertical memory 600 formed by the technique can include a memory cell substantially similar to the vertical memory cell 300 shown in FIG. 3.

Figure 7A:
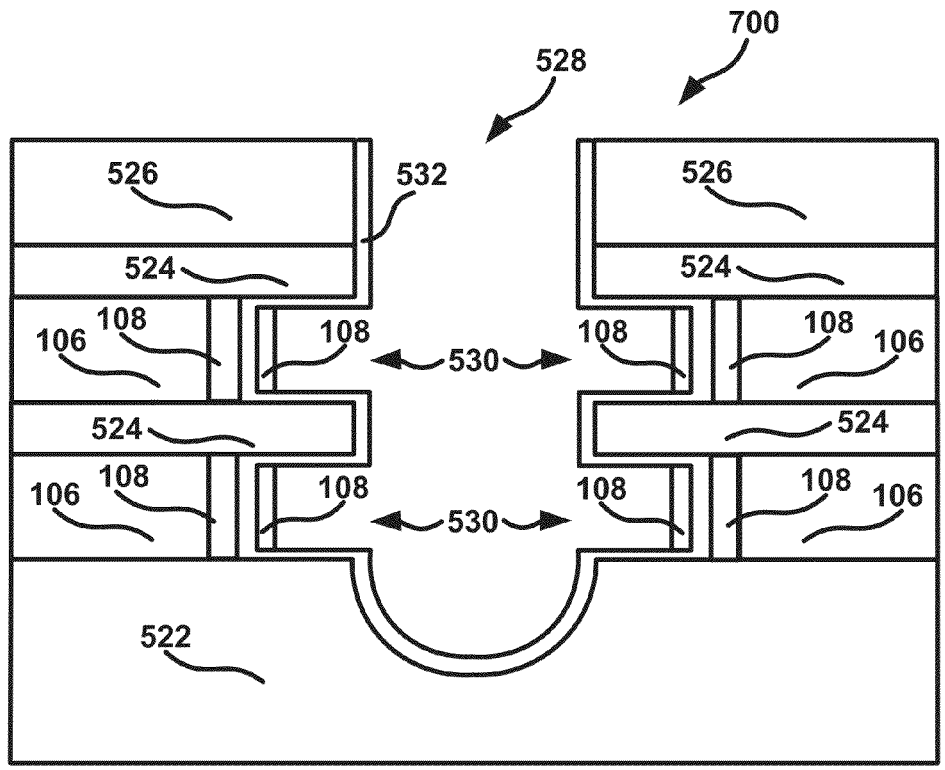
FIGS. 7A-D illustrate another example of a technique of making a vertical memory.
Figure 7B:
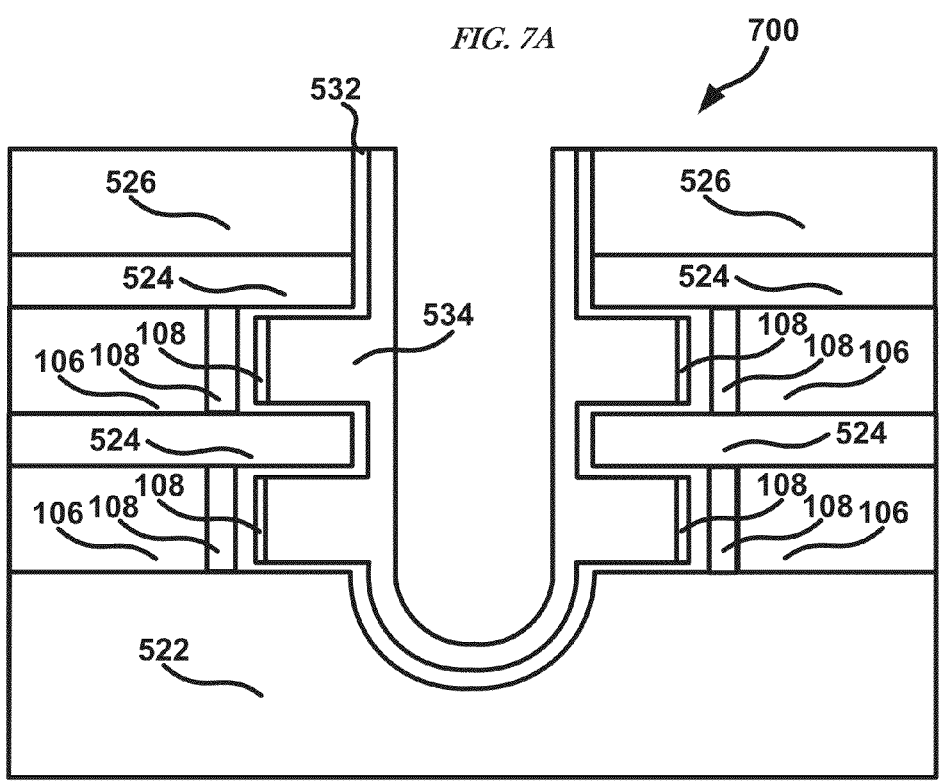
Figure 7C:
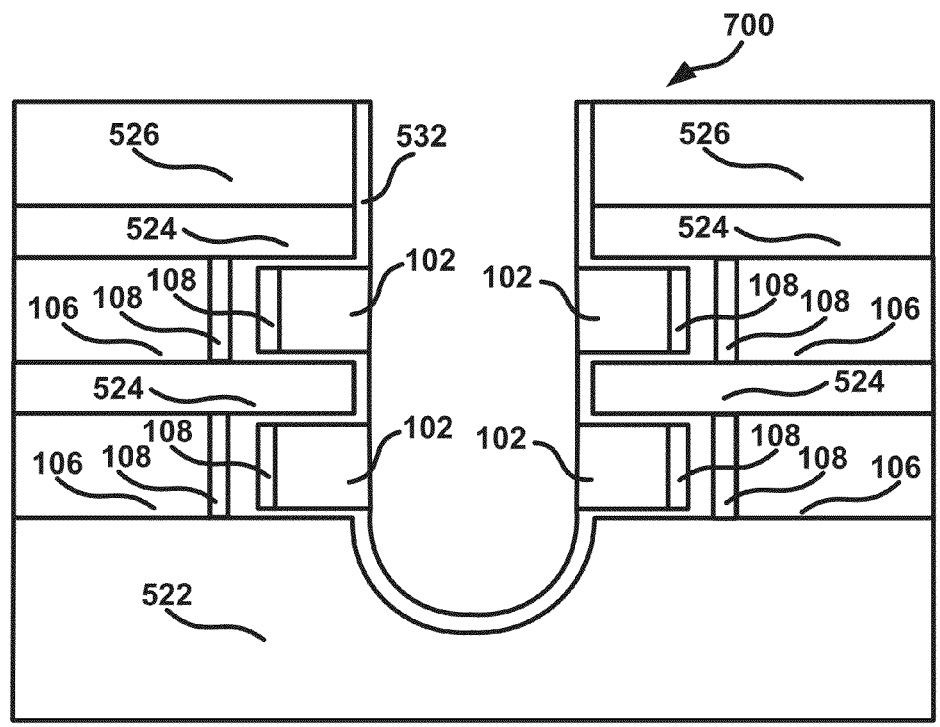
Figure 7D:
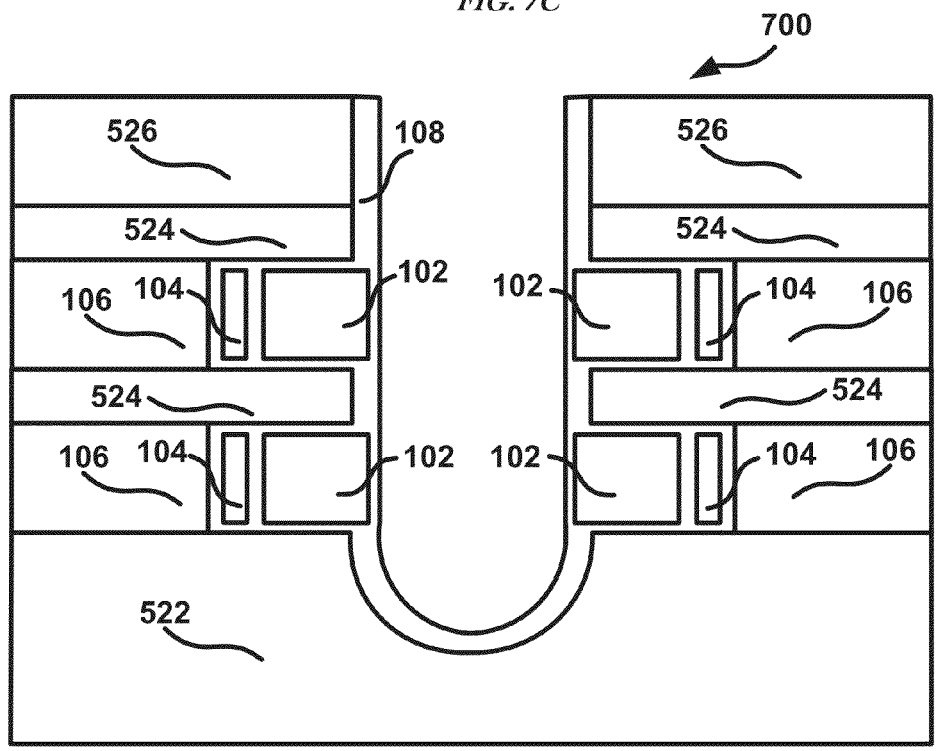

FIGS. 7A-D illustrate another technique of forming a vertical memory 700. The technique can include the process described with regard to FIGS. 6A-C. A vertical memory, such as the vertical memory 600 depicted in FIG. 6C, can have a second layer of dielectric 108 formed on the barrier material 532 in the trench 528 and CG recesses 530. The second layer of dielectric 108 can be at least partially removed, such as shown in FIG. 7A. As shown in FIG. 7B, the trench 528 and the CG recesses 530 can be at least partially filled with a charge storage material 534 (e.g., such that the charge storage material 534 is on the second layer of dielectric 108). The charge storage material 534 can be at least partially removed from the trench 528 to form a FG 102, such as shown in FIG. 7C. As shown in FIG. 7D, the barrier material 532 can be at least partially removed, such as by using hot phosphoric acid, and a third layer of dielectric 108 can be formed on exposed surfaces of the trench 528 and the CG recesses 530. The third layer of dielectric 108, such as high temperature oxide, can be formed using a deposition process. The dielectric 108 can form a tunnel oxide. A pillar 110 can be formed in the trench 528, such as shown in FIG. 5G.

Figure 8A:
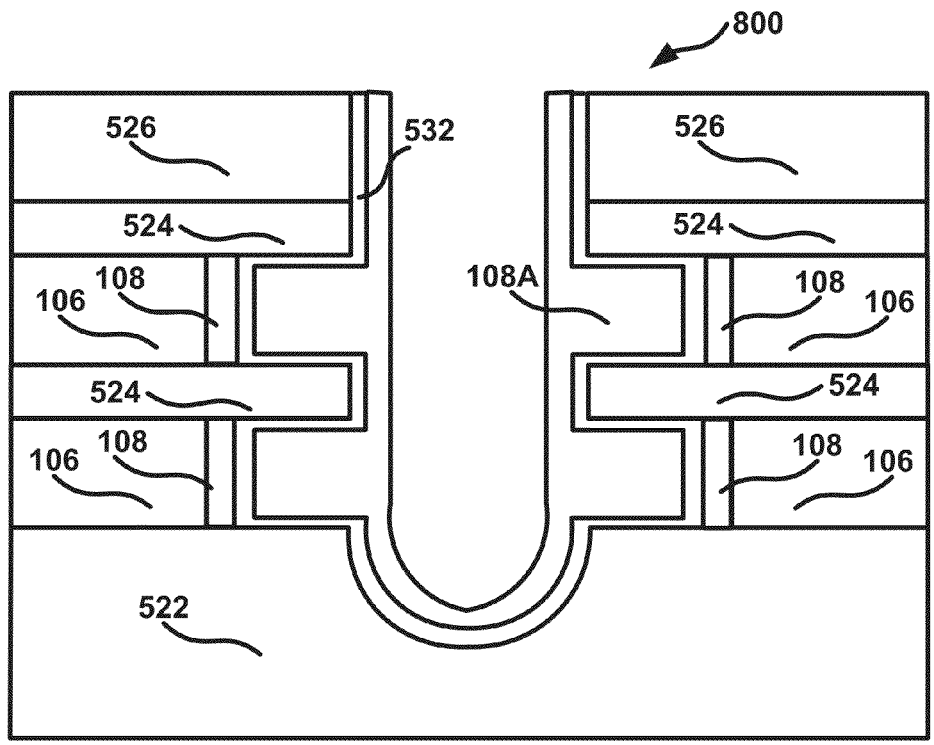
FIGS. 8A-F illustrate other examples of techniques of making a vertical memory.
Figure 8B:
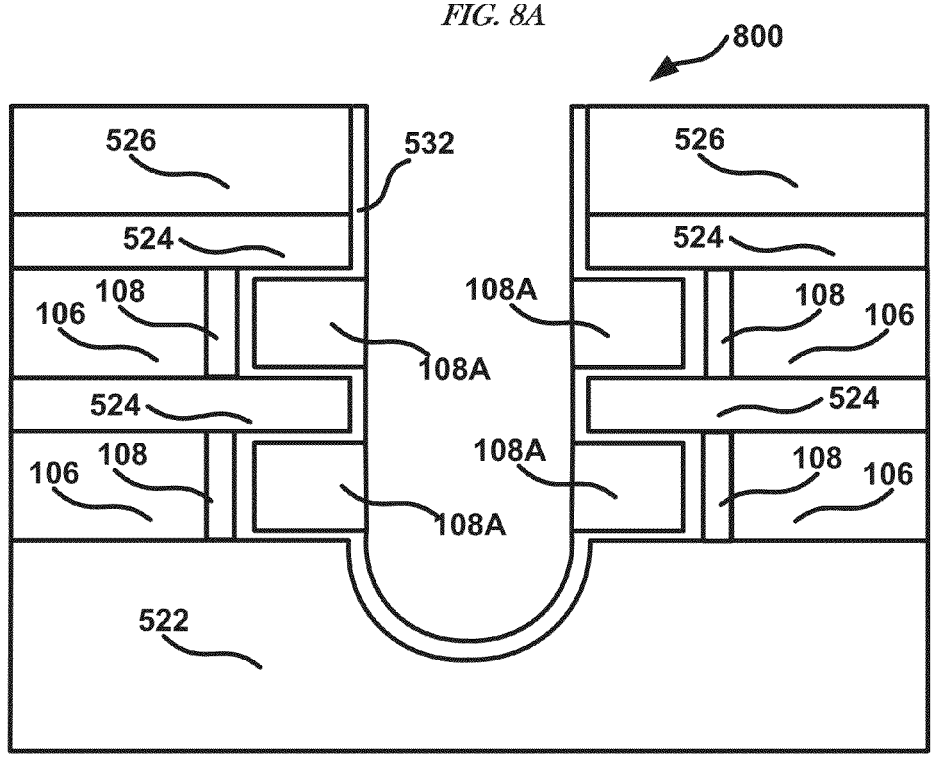
Figure 8C:
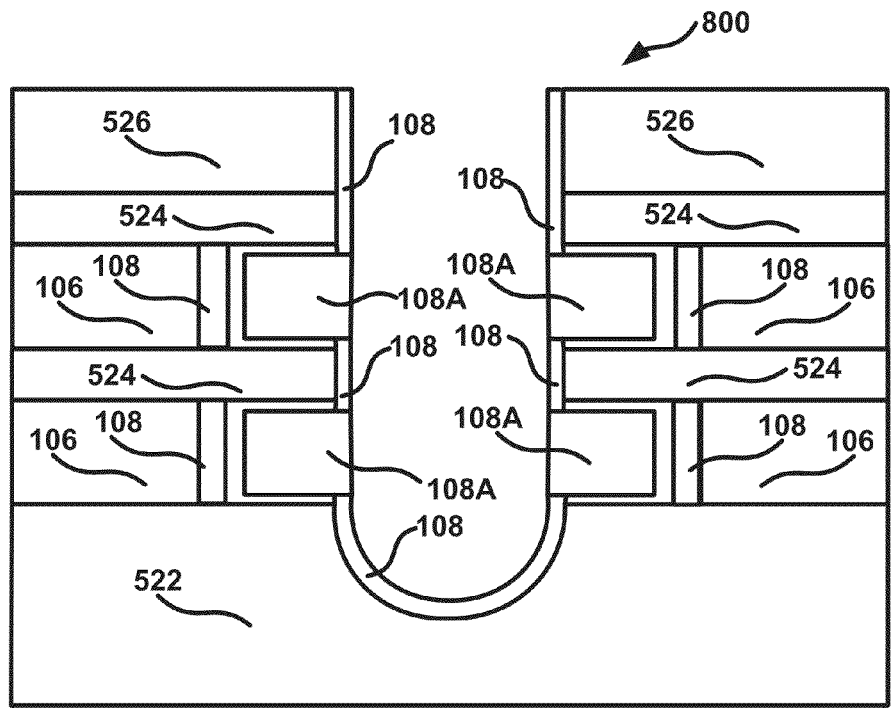
Figure 8D:
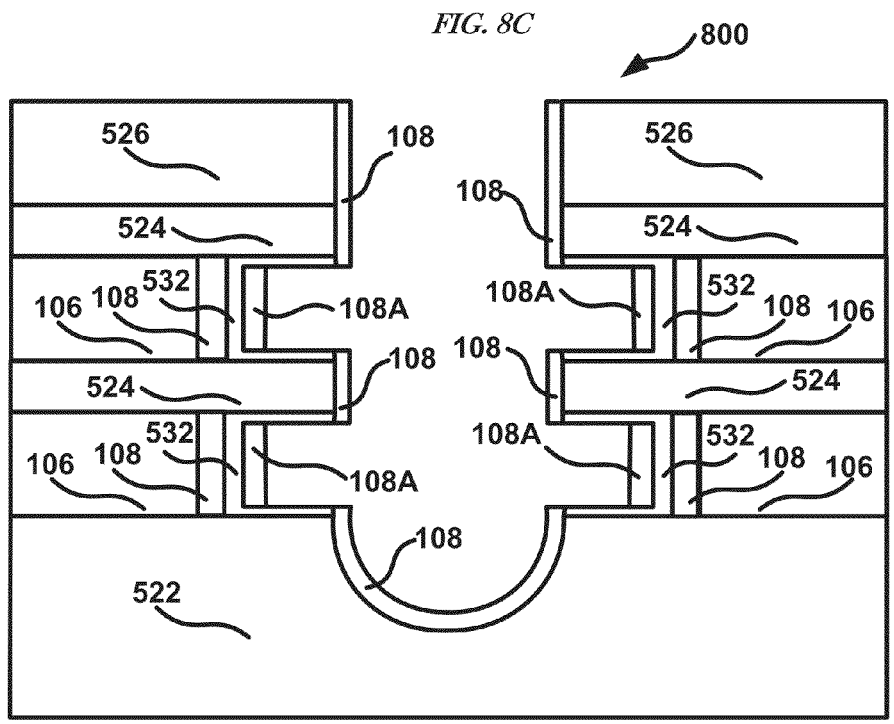

The vertical memory 600 depicted in FIG. 6C can be filled, such as by using an ALD process. The ALD process can fill the CG recesses 530 and at least partially fill the trench 528 with dielectric 108A, such as shown in FIG. 8A. At least some of the dielectric 108A in the trench 528 can be removed. The dielectric 108A can be left substantially flush with barrier material 532 in the trench 528, such as shown in FIG. 8B. FIG. 8C shows the vertical memory 800 after barrier material 532 has been removed by converting it to dielectric through an in situ steam generation (ISSG) process. Such a process can remove portions of barrier material 532, such as by converting portions of barrier material 532 to dielectric 108. FIG. 8D shows the vertical memory 800 after the dielectric 108A has been etched back using wet chemistry (e.g., hydrofluoric acid). The dielectric 108 produced from the ISSG process can be etched selectively to the dielectric material 108A in the CG recesses 530. The dielectric 108 on the sidewall (e.g., nitride converted to oxide using an ISSG process) can etch away slower than the other dielectric 108A. An FG 102 can be formed in the CG recess 530 to form a vertical memory 800 including memory cells substantially similar to the memory of FIG. 1. Such a vertical memory can include an FG 102 that includes a larger dimension (e.g., length), that extends into the trench 528 to be flush with the dielectric 108 in the trench 528.

Figure 8E:
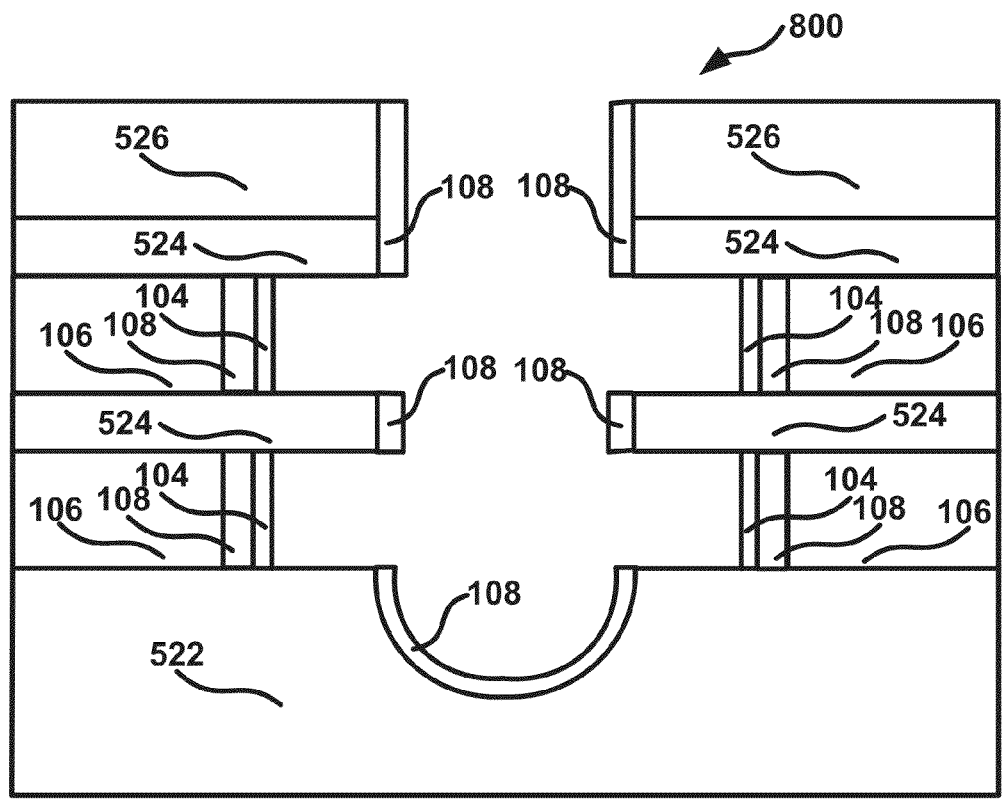
Figure 8F:
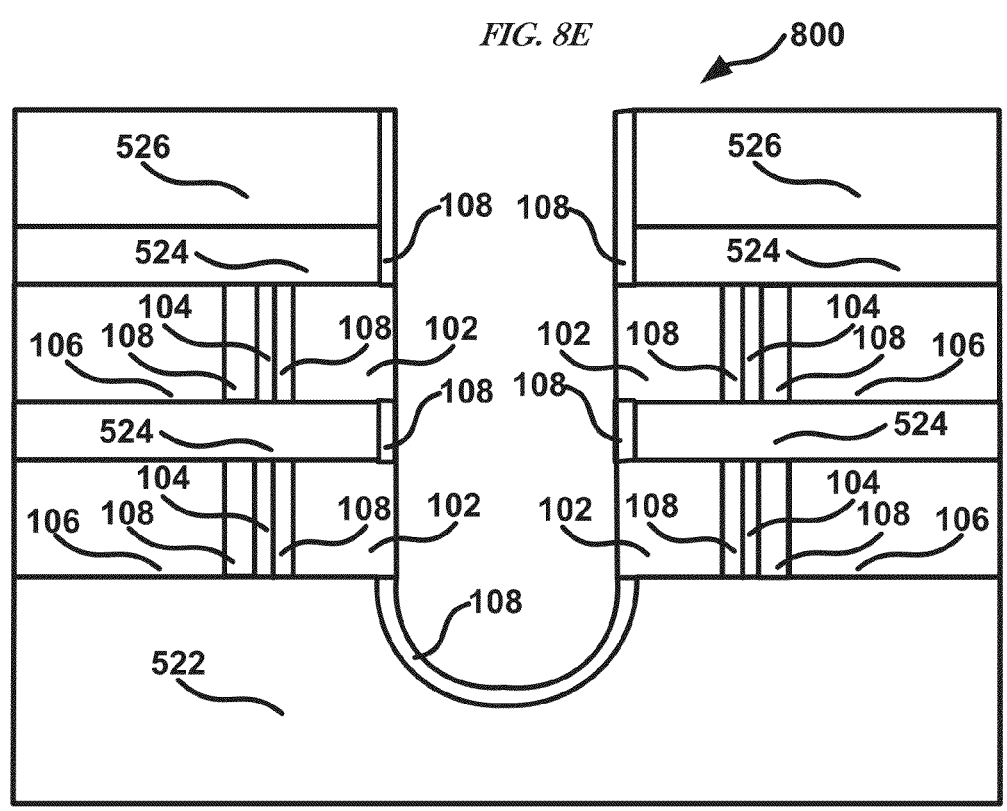

Alternatively, the vertical memory 800 depicted in FIG. 8C can be etched using hot phosphoric acid. The hot phosphoric acid can etch dielectric 108A and 108 and barrier material 532 to form barrier film 104 in the CG recesses 530, such as shown in FIG. 8E. The dielectric 108 can be more resistant to hot phosphoric acid etching than the dielectric 108A. For example, exposing dielectric 108 to hot phosphoric acid for one minute can remove less dielectric 108 than would be removed by exposing dielectric 108A to the same hot phosphoric acid for the same amount of time. A dielectric 108 can be formed adjacent to the barrier film 104 and an FG 102 can be formed adjacent to the dielectric 108. The resulting structure is depicted in FIG. 8F.

Figure 9:
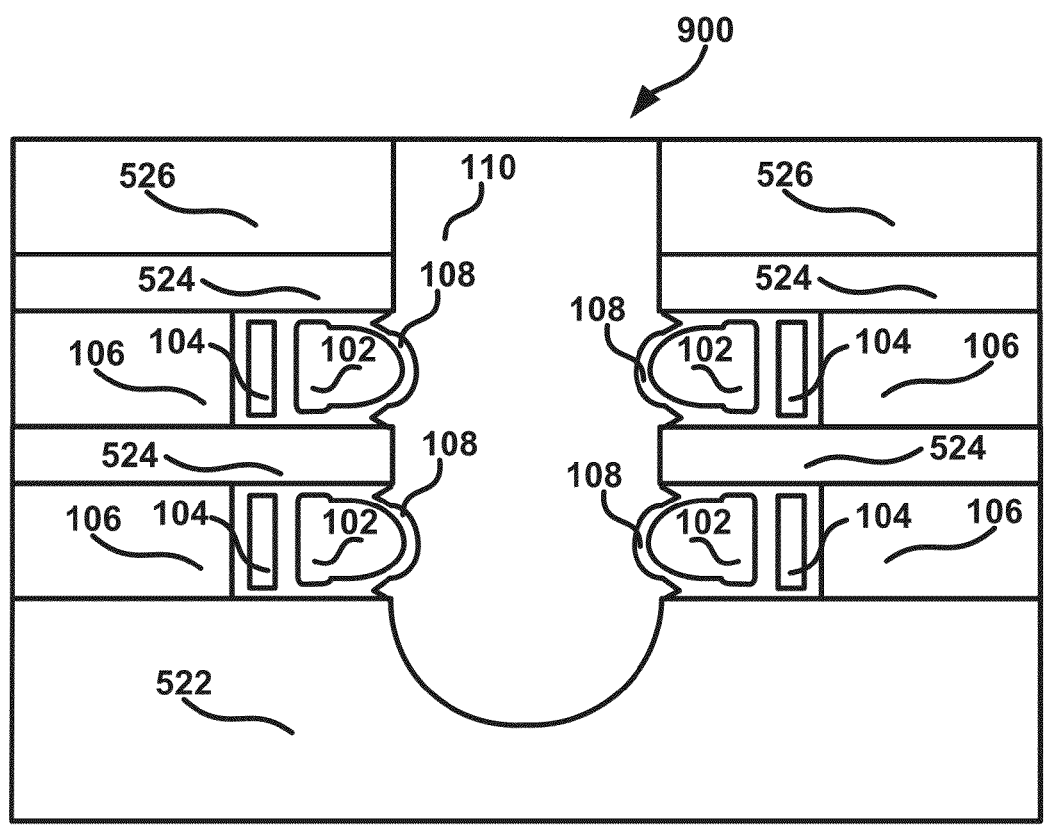
FIG. 9 illustrates a cross-section view of an example of a vertical memory.

FIG. 9 shows an example of a vertical memory 900, which can be formed using substantially the same technique as a memory cell corresponding to FIGS. 7A-D. The dielectric 108 that forms the tunnel oxide can be grown. Such growing can include using an ISSG process. Using such a process can convert silicon to oxide, such as to convert some of the FG 102 to oxide. Such a process can round corners of the FG 102 or remove a portion of the FG 102 adjacent to the tier dielectric 524, such as shown in FIG. 9. Such a process can alter the geometry of subsequent material formed on the FG 102, such as dielectric 108 and pillar 110, such as shown in FIG. 9.

Figure 10A:
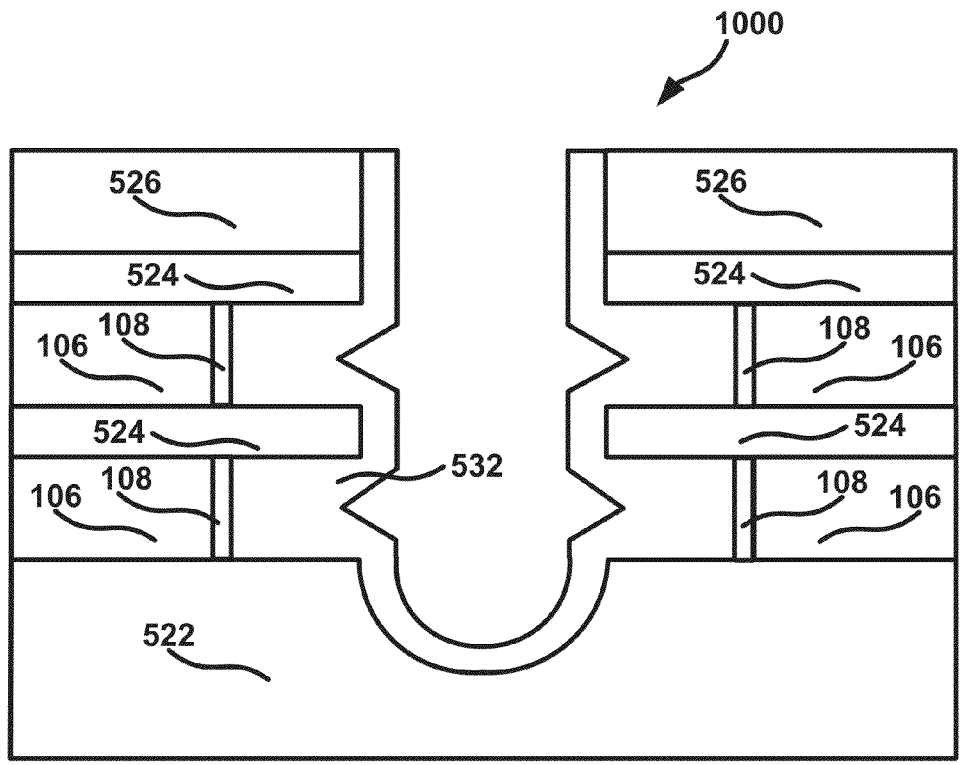
FIGS. 10A-B illustrate an example of a technique of making a vertical memory.
Figure 10B:
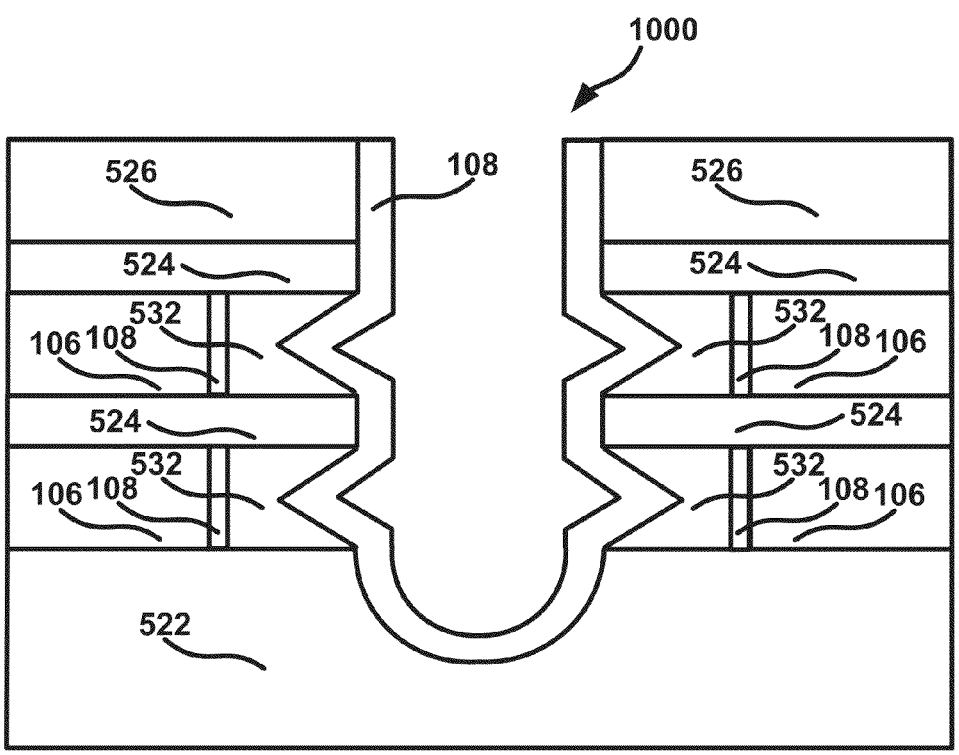

FIGS. 10A-B show an example of a technique of forming a vertical memory 1000. The vertical memory 1000 can include a structure substantially similar to the vertical memory 600 depicted in FIG. 6B. A barrier material 532 can be deposited on sidewalls of the trench 528 and within the CG recesses 530, such as shown in FIG. 10A. The memory cell 1000 can be oxidized, such as by using an ISSG process, to convert portions of the barrier material 532 to a dielectric 108, such as an oxynitride dielectric. An example of the resulting structure is shown in FIG. 10B. The dielectric 108 can be removed and some of the remaining barrier material 532 can be removed, such as to form a barrier film 104, such as shown in FIG. 6G. The remaining portions of the memory cell 1000 can be formed using a technique substantially similar to the technique depicted in FIGS. 6H-K, such as to form a vertical memory 1000 substantially similar to vertical memory 600 depicted in FIG. 6K.

Figure 11:
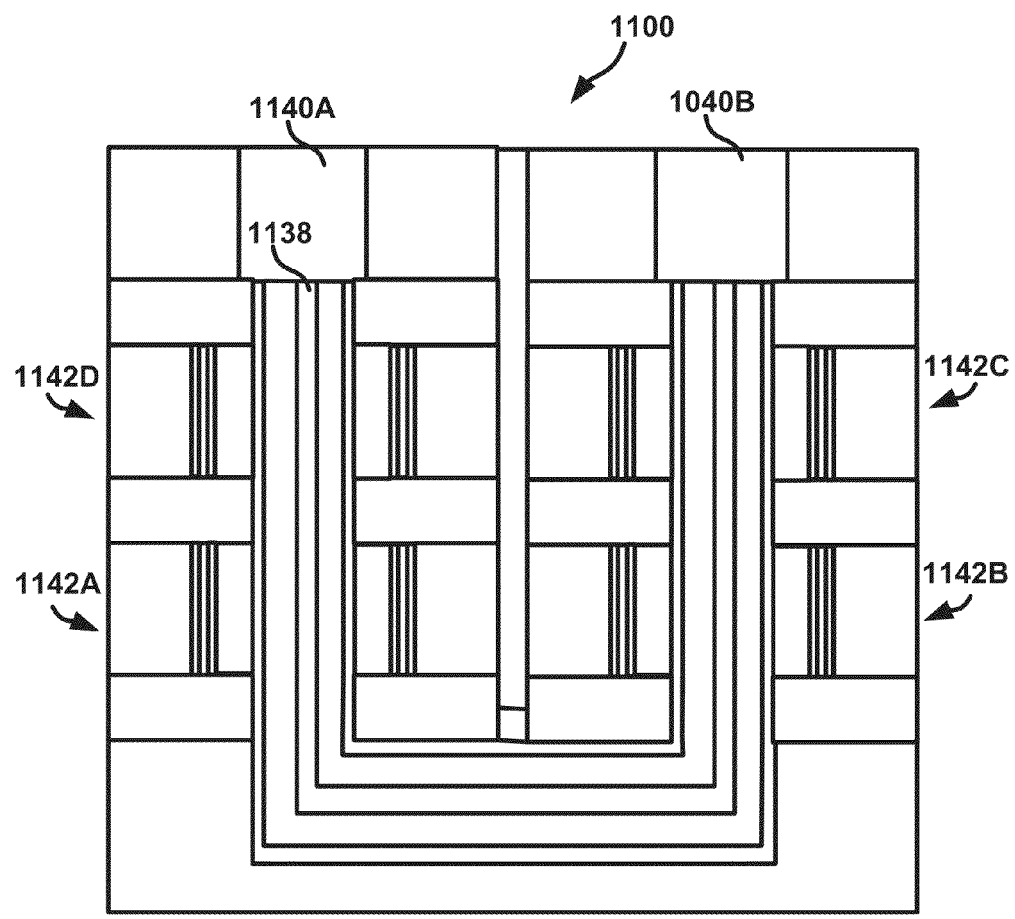
FIG. 11 illustrates an example of a memory array.

FIG. 11 shows an example of a memory array 1100. In the memory array 1100, memory cells 1142A-C can be electrically coupled through a channel 1138. The channel 1138 can be electrically coupled to one or more data line contacts 1140A-B. Memory cells 1142A-D of the memory array 1100 can be substantially similar to memory cells discussed herein, such as those shown in FIG. 2, 5G, 6K, 7D, 9, or 10B.

A problem associated with memory cells that include a barrier film, such as nitride, adjacent to an FG on more than one side can be charges getting trapped in portions of the nitride that do not separate the FG and a CG (e.g., in portions of the nitride that are not directly between the FG and the CG). Also, trapped charge can migrate along the IGD, such as through program, erase, or temperature cycling. Such charge trapping or movement can alter the threshold voltage ($V_t$) of the memory cell or degrade incremental step pulse programming (ISPP) relative to memory cells that do not have such charge trapping in the nitride.

Such charge trapping or migration on the nitride can be at least partially eliminated by including nitride adjacent to only one surface of the FG (e.g., by including nitride that is substantially rectangular and not "U" shaped). Such a configuration can include charge being trapped on the FG rather than on the nitride.

An advantage of one or more embodiments can include reducing the incidents of erase saturation in memory cells. Another advantage can include improved alignment between the FG and CG due to eliminating a source of variation in manufacturing, such as the nitride wrapping in irregular shapes around corners in a CG recess or a tier oxide. Instead the FG shape and size can be defined by a plasma enhanced chemical vapor deposition (PECVD) process, which can be a substantially uniform stack deposition process.

Program and erase properties of a memory cell are a function of a gate coupling ratio, which is a function of a capacitance between the FG and the CG of a memory cell. With a wrapped nitride, such as shown in FIG. 1, the capacitance is a function of the distance between the opposing surfaces of the CG 106 and the FG 102A and the distances between the top and bottom surfaces of the FG and the nitride adjacent thereto, such as shown by the arrows in FIG. 1. With a memory cell 200 that includes a planar barrier film 104B, such as shown in FIG. 2, the capacitance created between the IGD and the FG can be reduced or eliminated, such as to make the capacitance a function of the distance between a surface of the FG 102B and an opposing surface of the CG 106. Such a configuration can reduce the sources of variation in the gate coupling ratio, such as to improve the uniformity in memory cell program and erase performance. A device with improved FG to CG alignment can include an improved $V_g V_t$. Another advantage can include reducing ISPP degradation issues or maintaining a sufficiently low $V_t$, such as by reducing the Vt shift caused by cycling by reducing the charge trapped on the nitride.

Another advantage can include an increased channel length to memory cell first dimension ratio, such a configuration can increase the reliability of the respective memory cell.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method of forming a memory stack, the method comprising:
   forming a plurality of control gates and control gate recesses between tier dielectric layers;
   forming a first layer of dielectric material on the plurality of control gates in the control gate recesses;
   forming barrier material in the control gate recesses and on the first layer of dielectric material;
   removing portions of the barrier material to form barrier films adjacent to the control gates;
   forming a second layer of dielectric material on the barrier films;
   forming charge storage structure material on the second layer of dielectric material; and
   removing portions of the charge storage structure material to form charge storage structures, each of the charge storage structures having a dimension that is substantially equal to a corresponding dimension of a respective one of the barrier films.

2. The method of claim 1, further comprising:
   before removing the portions of the barrier material, forming sacrificial material on the barrier material and removing portions of the sacrificial material; and
   before forming the second layer of dielectric material, removing the remaining sacrificial material.

3. The method of claim 1, wherein removing portions of the barrier material to form the barrier films includes removing the portions of the barrier material to form each of the barrier films to have a dimension that is substantially equal to a corresponding dimension of a respective one of the control gates.

4. The method of claim 1, wherein forming the plurality of control gates comprises forming a plurality of polysilicon control gates.

5. The method of claim 1, wherein forming barrier material comprises forming nitride.

6. The method of claim 1, wherein forming charge storage material comprises forming polysilicon.

7. The method of claim 1, wherein forming the memory stack includes forming a NAND memory stack.

8. A method of forming a memory stack, the method comprising:
   forming a plurality of control gates and control gate recesses between tier dielectric layers;
   forming a first layer of dielectric material on the plurality of control gates in the control gate recesses;
   forming barrier material in the control gate recesses and on the first layer of dielectric material;
   forming a second layer of dielectric material on the barrier material;
   forming charge storage structure material on the second layer of dielectric material;
   removing portions of the charge storage structure material to form charge storage structures, each of the charge storage structures having a dimension that is substantially equal to a corresponding dimension of a respective one of the barrier films;
   removing portions of the barrier material to form barrier films adjacent to the control gates; and
   forming a third layer of dielectric material on exposed surfaces of the plurality of control gate recesses.

9. The method of claim 8, further comprising:
   before removing the portions of the barrier material, forming sacrificial material on the barrier material and removing portions of the sacrificial material; and
   before forming the second layer of dielectric material, removing the remaining sacrificial material.

10. The method of claim 8, wherein removing portions of the barrier material to form the barrier films includes removing the portions of the barrier material to form each of the barrier films to have a dimension that is substantially equal to a corresponding dimension of a respective one of the control gates.

11. The method of claim 8, wherein forming the plurality of control gates comprises forming a plurality of polysilicon control gates.

12. The method of claim 8, wherein forming barrier material comprises forming nitride.

13. The method of claim 8, wherein forming charge storage material comprises forming polysilicon.

14. The method of claim 8, wherein forming the memory stack includes forming a NAND memory stack.

15. The method of claim 8, wherein removing portions of the barrier material includes converting portions of the barrier to dielectric through an in situ steam generation process; and
   the method further comprises etching dielectric material covering the barrier material.

16. A method of forming a memory stack, the method comprising:
   forming a plurality of control gates in control gate recesses;
   forming a first dielectric on each the plurality of control gates and in the control gate recesses;
   forming a barrier film material in the control gate recesses and on the first dielectric;
   forming a second dielectric on the barrier film material;
   forming a charge storage structure on the second dielectric; and
   removing a portion of the charge storage structure to form a charge storage structure having a dimension that is substantially equal to the corresponding dimension of the barrier film material in the control gate recess.

17. The method of claim 16, further comprising removing portions of the barrier material to form barrier films adjacent to the control gates.

18. The method of claim 17, wherein forming the barrier film material includes forming the barrier film material such that the barrier film has a face and forming the charge storage structure includes forming the charge storage structure to have a face opposing the face of the barrier film and substantially parallel to the face of the barrier film, wherein each part of the face of the barrier film is separated from the face of the charge storage structure by a substantially equal distance.

19. The memory of claim 17, wherein forming the charge storage structure includes forming the charge storage structure to have a substantially planar side facing the barrier film, forming the control gate includes forming the control gate to have a substantially planar side facing the barrier film, and the forming the barrier film includes forming the barrier film to have a first substantially planar side facing and substantially parallel to the substantially planar side of the charge storage structure and a second substantially planar side facing and substantially parallel to the substantially planar side of the control gate.

20. The method of claim 16, further comprising forming a third dielectric on exposed surfaces of the plurality of control gate recesses.

* * * * *